United States Patent
Harada et al.

(10) Patent No.: US 9,012,896 B2
(45) Date of Patent: *Apr. 21, 2015

(54) ORGANIC EL ELEMENT

(71) Applicant: Panasonic Corporation, Osaka (JP)

(72) Inventors: Kenji Harada, Hyogo (JP); Seiji Nishiyama, Osaka (JP); Takahiro Komatsu, Osaka (JP); Takayuki Takeuchi, Hyogo (JP); Satoru Ohuchi, Osaka (JP); Yoshiaki Tsukamoto, Osaka (JP); Shinya Fujimura, Osaka (JP); Kei Sakanoue, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/742,593

(22) Filed: Jan. 16, 2013

(65) Prior Publication Data
US 2013/0126847 A1    May 23, 2013

Related U.S. Application Data

(63) Continuation of application No. PCT/JP2010/004989, filed on Aug. 6, 2010.

(51) Int. Cl.
*H01L 51/50*   (2006.01)
*H01L 27/32*   (2006.01)
*H01L 51/56*   (2006.01)

(52) U.S. Cl.
CPC ........ *H01L 51/5012* (2013.01); *H01L 27/3246* (2013.01); *H01L 51/5088* (2013.01); *H01L 51/56* (2013.01); *H01L 51/5004* (2013.01); *H01L 2251/552* (2013.01)

(58) Field of Classification Search
CPC . H01L 51/0036; H01L 51/56; H01L 51/0545; H01L 51/5012
USPC ............................................. 257/40; 438/22
See application file for complete search history.

(56) References Cited

U.S. PATENT DOCUMENTS

| | | |
|---|---|---|
| 5,294,869 A | 3/1994 | Tang et al. |
| 5,443,922 A | 8/1995 | Nishizaki et al. |

(Continued)

FOREIGN PATENT DOCUMENTS

| | | |
|---|---|---|
| CN | 101170124 | 4/2008 |
| EP | 2175504 | 4/2010 |

(Continued)

OTHER PUBLICATIONS

Meyer et al., Charge generation layers comprising transition metal-oxide/organic interfaces: Electronic structure and charge generation mechanism, May 2010, Applied Physics Letters, 96, 193302, pp. 1-3.*

(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

In an organic EL element, a bank is formed on a hole injection layer so as to surround light-emitting layer. The hole injection layer is formed with a tungsten oxide thin film, and has, in an electronic state thereof, an occupied energy level 1.8 eV to 3.6 eV lower than the lowest energy level of a valence band of the hole injection layer. The hole injection layer has a recessed portion in an upper surface thereof. An inner surface of the recessed portion is in contact with a functional layer (light-emitting layer). the inner side surface of the recessed portion includes an upper edge that is one of aligned with part of a lower edge of the bank, the part being in contact with the functional layer, and in contact with a bottom surface of the bank.

20 Claims, 28 Drawing Sheets

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,058,797 B2 | 11/2011 | Frey et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0073243 A1 | 4/2005 | Yamazaki et al. |
| 2005/0170208 A1 | 8/2005 | Yatsunami et al. |
| 2005/0208206 A1 | 9/2005 | Yoshikawa |
| 2005/0266763 A1* | 12/2005 | Kimura et al. ............. 445/24 |
| 2006/0008931 A1 | 1/2006 | Lee et al. |
| 2006/0181583 A1 | 8/2006 | Usuda |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1 | 2/2007 | Liu |
| 2007/0092981 A1 | 4/2007 | Jung et al. |
| 2007/0148333 A1 | 6/2007 | Morimoto |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0063949 A1 | 3/2008 | Inoue |
| 2008/0100209 A1 | 5/2008 | Ito |
| 2008/0150422 A1 | 6/2008 | Ohara |
| 2008/0231179 A1 | 9/2008 | Abe et al. |
| 2008/0312437 A1 | 12/2008 | Inoue et al. |
| 2009/0058268 A1 | 3/2009 | Yoshida et al. |
| 2009/0115318 A1 | 5/2009 | Gregory et al. |
| 2009/0160325 A1 | 6/2009 | Yatsunami et al. |
| 2009/0200917 A1 | 8/2009 | Yamagata et al. |
| 2009/0224664 A1 | 9/2009 | Yoshida et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2009/0284146 A1 | 11/2009 | Yoshida et al. |
| 2010/0084672 A1 | 4/2010 | Ueno et al. |
| 2010/0102310 A1 | 4/2010 | Komatsu et al. |
| 2010/0181554 A1* | 7/2010 | Yoshida et al. ............. 257/40 |
| 2010/0213827 A1 | 8/2010 | Yoshida et al. |
| 2010/0252857 A1 | 10/2010 | Yoshida |
| 2010/0258833 A1 | 10/2010 | Okumoto et al. |
| 2010/0302221 A1 | 12/2010 | Okumoto |
| 2011/0037065 A1 | 2/2011 | Ueno et al. |
| 2011/0037068 A1* | 2/2011 | Yamazaki et al. ............. 257/43 |
| 2011/0042703 A1 | 2/2011 | Okumoto et al. |
| 2011/0140091 A1 | 6/2011 | Friend et al. |
| 2011/0140596 A1 | 6/2011 | Yoshida et al. |
| 2011/0180821 A1 | 7/2011 | Matsushima |
| 2011/0198623 A1 | 8/2011 | Matsushima |
| 2011/0198624 A1 | 8/2011 | Matsushima |
| 2011/0204410 A1 | 8/2011 | Yada |
| 2012/0061656 A1 | 3/2012 | Ohuchi et al. |
| 2012/0132934 A1 | 5/2012 | Ohuchi et al. |
| 2012/0132935 A1 | 5/2012 | Isobe et al. |
| 2012/0178191 A1 | 7/2012 | Sakanoue et al. |

FOREIGN PATENT DOCUMENTS

| | | | |
|---|---|---|---|
| JP | 05-163488 A | 6/1993 | |
| JP | 10-162959 A | 6/1998 | |
| JP | 2000-133446 A | 5/2000 | |
| JP | 2000-223276 A | 8/2000 | |
| JP | 2002-075661 A | 3/2002 | |
| JP | 2002-530881 A | 9/2002 | |
| JP | 2002-318556 A | 10/2002 | |
| JP | 3369615 B2 | 11/2002 | |
| JP | 2003-007460 A | 1/2003 | |
| JP | 2003-249375 A | 9/2003 | |
| JP | 2003-264083 A | 9/2003 | |
| JP | 2004-139746 A | 5/2004 | |
| JP | 2004-228355 A | 8/2004 | |
| JP | 2004-234901 A | 8/2004 | |
| JP | 2004-527093 A | 9/2004 | |
| JP | 2004-363170 A | 12/2004 | |
| JP | 2005-012173 A | 1/2005 | |
| JP | 2005-197189 A | 7/2005 | |
| JP | 2005-203339 A | 7/2005 | |
| JP | 2005-203340 A | 7/2005 | |
| JP | 2005-267926 A | 9/2005 | |
| JP | 2005-268099 A | 9/2005 | |
| JP | 2005-331665 A | 12/2005 | |
| JP | 2006-024573 A | 1/2006 | |
| JP | 2006-114928 A | 4/2006 | |
| JP | 3789991 B2 | 4/2006 | |
| JP | 2006-185869 A | 7/2006 | |
| JP | 2006-253443 A | 9/2006 | |
| JP | 2006-294261 A | 10/2006 | |
| JP | 2006-344459 A | 12/2006 | |
| JP | 2007-073499 A | 3/2007 | |
| JP | 2007-095606 A | 4/2007 | |
| JP | 2007-214066 A | 8/2007 | |
| JP | 2007-527542 A | 9/2007 | |
| JP | 2007-287353 A | 11/2007 | |
| JP | 2007-288071 A | 11/2007 | |
| JP | 2007-288074 A | 11/2007 | |
| JP | 2008-041747 A | 2/2008 | |
| JP | 2008-053556 A | 3/2008 | |
| JP | 2008-091072 A | 4/2008 | |
| JP | 2008-124268 A | 5/2008 | |
| JP | 2008-140724 A | 6/2008 | |
| JP | 2008-177557 A | 7/2008 | |
| JP | 2008-241238 A | 10/2008 | |
| JP | 2008-270731 A | 11/2008 | |
| JP | 2009-004347 A | 1/2009 | |
| JP | 2009-044103 A | 2/2009 | |
| JP | 2009-048960 A | 3/2009 | |
| JP | 2009-054582 A | 3/2009 | |
| JP | 2009-058897 A | 3/2009 | |
| JP | 2009-218156 A | 9/2009 | |
| JP | 2009-239180 A | 10/2009 | |
| JP | 2009-260306 A | 11/2009 | |
| JP | 2009-277590 A | 11/2009 | |
| JP | 2009-277788 A | 11/2009 | |
| JP | 2010-010670 A | 1/2010 | |
| JP | 2010-021138 A | 1/2010 | |
| JP | 2010-021162 A | 1/2010 | |
| JP | 2010-033972 A | 2/2010 | |
| JP | 2010-050107 A | 3/2010 | |
| JP | 2010-073700 A | 4/2010 | |
| JP | 2010-103374 A | 5/2010 | |
| JP | 2010-161070 A | 7/2010 | |
| JP | 2010-161185 A | 7/2010 | |
| JP | 2011-040167 A | 2/2011 | |
| WO | 2004/036663 | 4/2004 | |
| WO | 2008/120714 A1 | 10/2008 | |
| WO | 2008/149498 A1 | 12/2008 | |
| WO | 2008/149499 A1 | 12/2008 | |
| WO | WO 2009/107323 A1 * | 3/2009 | ............. 257/40 |
| WO | 2010/032443 A1 | 3/2010 | |
| WO | 2010/032444 A1 | 3/2010 | |
| WO | 2010/058716 A1 | 5/2010 | |
| WO | 2010/070798 A1 | 6/2010 | |
| WO | 2010/092795 A1 | 8/2010 | |
| WO | 2010/092796 A1 | 8/2010 | |
| WO | 2010/092797 A1 | 8/2010 | |
| WO | 2011/021343 A1 | 2/2011 | |
| WO | 2012/017495 A1 | 2/2012 | |
| WO | 2012/017502 A1 | 2/2012 | |
| WO | 2012/017503 A1 | 2/2012 | |

OTHER PUBLICATIONS

Hyunbok Lee et al., "The origin of the hole injection improvements at indium tin oxide/molybdenum trioxide/N,N'-bis (1-naphthyl)-

(56) References Cited

OTHER PUBLICATIONS

N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

U.S. Appl. No. 13/205,748, Kenji Harada et al., filed Aug. 9, 2011.
U.S. Appl. No. 13/298,528, Satoru Ohuchi et al., filed Nov. 27, 2011.
U.S. Appl. No. 13/739,363, Seiji Nishiyama et al., filed Jan. 11, 2013.
U.S. Appl. No. 13/746,485, Kenji Harada et al., filed Jan. 22, 2013.
U.S. Appl. No. 13/746,474, Kenji Harada et al., filed Jan. 22, 2013.
U.S. Appl. No. 13/742,584, Kenji Harada et al., filed Jan. 16, 2013.
International Search Report in PCT/JP2010/000781, dated Apr. 6, 2010.
International Search Report in PCT/JP2010/004471, dated Oct. 5, 2010.
International Search Report in PCT/JP2010/004987, dated Sep. 7, 2010.
International Search Report in PCT/JP2010/004993, dated Sep. 7, 2010.
International Search Report in PCT/JP2010/004989, dated Sep. 7, 2010.
International Search Report in PCT/JP2010/004960, dated Nov. 9, 2010.
International Search Report in PCT/JP2010/004991, dated Nov. 16, 2010.
International Search Report in PCT/JP2011/000324, dated Feb. 22, 2011.
International Search Report in PCT/JP2012/000288, dated Apr. 17, 2012.
Extended European Search Report (EESR) in European Patent Application No. 10741075.5, dated Feb. 11, 2013.
United States Office Action in U.S. Appl. No. 13/298,528, dated Jan. 11, 2013.
United States Office Action in U.S. Appl. No. 13/298,528, dated May 17, 2013.
Japan Office Action in Japanese Patent Application No. 2009-189658, dated Apr. 8, 2013.
STELLA Tsuushin (STELLA communication), Stella Corporation, undated, *available* at http://www.stellacorp.co.jp/media/conference#past/0902sorst.html, *accessed* on Apr. 8, 2013, together with a partial English language translation.
L. Chkoda et al., "Work function of ITO substrates and band-offsets at the TPD/ITO interface determined by photoelectron spectroscopy", Synthetic metals 111-112, pp. 315-319 (2000).
U.S. Appl. No. 13/994,164, Satoru Ohuchi et al., filed Jun. 14, 2013.
U.S. Appl. No. 13/995,205, Takahiro Komatsu et al., filed Jun. 18, 2013.
United States Office Action in U.S. Appl. No. 13/205,748, dated Oct. 25, 2013.
Tungsten Trioxide, Wikipedia, The Free Encyclopedia, *available at* http://en.wikipedia.org/wiki/Tungsten(VI)_oxide, *accessed* Jan. 10, 2014.
Tungsten Oxide, McGraw-Hill Dictionary of Scientific and Technical Terms, McGraw-Hill Book Company, Fourth Edition, p. 1979, left column, date stamped Feb. 28, 1989.
Tungsten Oxide, Iwanami Rikagaku Jiten, Iwanami Shoten, Publishers, Fifth Edition, p. 533, left column, line 42 to right column, line 19, dated Feb. 20, 1998, together with an English language translation thereof.
China Office Action from State Intellectual Property Office (SIPO) in Chinese Patent Application No. 201080019186.5, dated Apr. 3, 2014, together with a partial English language translation.
Dinesh Kabra et al., "High Efficiency Composite Metal Oxide-Polymer Electroluminescent Devices: A Morphological and Material Based Investigation", Advanced Materials, vol. 20, Issue 18, pp. 3447-3452 (2008).
United States Office Action in U.S. Appl. No. 13/298,528, dated Jan. 14, 2014.
United States Office Action in U.S. Appl. No. 13/994,164, dated Jun. 5, 2014.
United States Notice of Allowance in U.S. Appl. No. 13/995,205, dated May 13, 2014.
United States Office Action in U.S. Appl. No. 13/205,748, dated Jun. 17, 2014.
China Office Action from State Intellectual Property Office (SIPO) in Chinese Patent Application No. 201080007024.X, dated Sep. 4, 2013, together with a partial English language translation.
China Office Action from State Intellectual Property Office (SIPO) in Chinese Patent Application No. 201080007024.X, dated May 15, 2014, together with a partial English language translation.
European Office Action in European Patent Application No. 10741075.5, dated Dec. 2, 2013.
Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).
Elam et al., Nucleation and growth during tungsten atomic layer deposition on SiO2 surfaces, Thin Solid Films, 386, pp. 41-52 (2001).
United States Office Action in U.S. Appl. No. 13/746,474, dated Apr. 11, 2014.
United States Office Action in U.S. Appl. No. 13/742,584, dated Apr. 14, 2014.
Ramana et al., "Electron microscopy investigation of structural transformation in tungsten oxide (WO3) thin films", Physica Status Solidi (a) 202, No. 10, pp. R108-R110 (Jul. 6, 2005).
Horsley et al., "Structure of Surface Tungsten Oxide Species in the WO3/AL2O3 Supported Oxide System from X-Ray Abortion Near-edge Spectroscopy and Raman Spectroscopy", Journal of Physical Chemistry, 91, pp. 4014-4020 (1987).
United States Office Action in U.S. Appl. No. 13/746,485, dated Apr. 25, 2014.

\* cited by examiner (A: a case where an appropriate number of injection sites exists in the tungsten oxide layer)

(B, C: a case where there are no injection sites in the tungsten oxide layer and a case where there is a shortage of injection sites in the tungsten oxide layer)

FIG. 23A
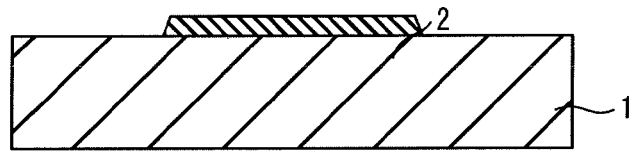
FIG. 23B
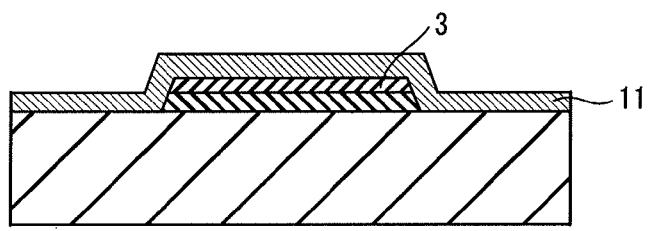
FIG. 23C
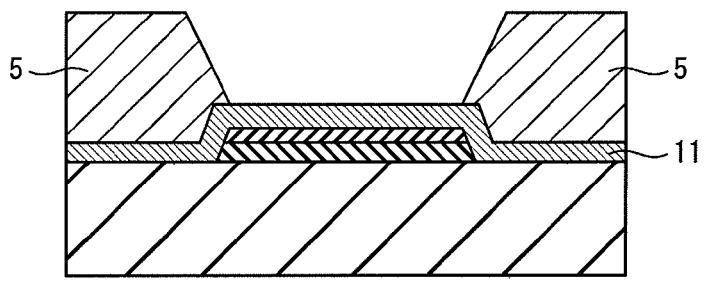
FIG. 23D
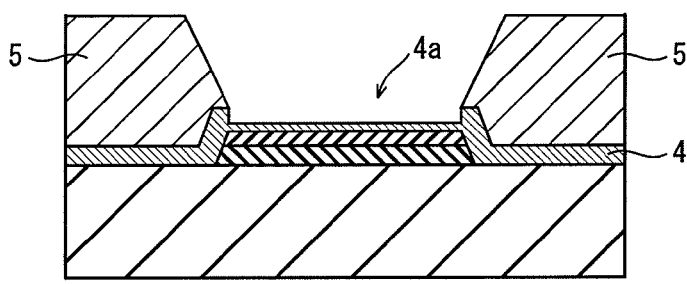

ORGANIC EL ELEMENT

CROSS REFERENCE TO RELATED APPLICATION

This is a continuation application of PCT Application No. PCT/JP2010/004989 filed Aug. 6, 2010, designating the United States of America, the disclosure of which, including the specification, drawings and claims, is incorporated herein by reference in its entirety.

TECHNICAL FIELD

The present disclosure relates to an organic electric-field light-emitting element (hereinafter "organic EL element"), which is an electric light emitter. Particularly, the present disclosure relates to a technology for driving such an organic EL element at low power while ensuring a wide range of luminous intensity from low luminous intensity to high luminous intensity for the use as a light source or the like.

TECHNICAL FIELD

In recent years, progress is being made in research and development of various functional elements which involve the use of an organic semiconductor.

Organic EL elements are known as being one of the most common among such functional elements. An organic EL element is a current-driven light emitter, and commonly includes a pair of electrodes consisting of an anode and a cathode, and a functional layer containing organic material disposed between the pair of electrodes. The functional layer includes layers such as a light-emitting layer and a buffer layer. Further, there are cases where a hole injection layer is disposed between the functional layer and the anode. The hole injection layer is disposed for injecting holes to the functional layer. When driving the organic EL element, voltage is applied between the pair of electrodes. The emission of light from the organic EL element is caused by an electric-field light-emitting phenomenon taking place as a result of the recombination of holes which are injected from the anode to the functional layer, and the electrons which are injected from the cathode to the functional layer. Now, more attention is being given to the application of organic EL elements as a light emitter or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the functional layer therein. The first type of organic EL elements is a vapor deposition type. A vapor deposition-type organic EL element has a functional layer that is mainly composed of low molecular material and that is formed as a film by applying a vacuum process such as a vapor deposition method. The second type of organic EL elements is an application type. An application-type organic EL element has a functional layer that is mainly composed of either high molecular material, or low molecular material having an excellent thin film forming property, and that is formed as a film by applying a wet process such as an inkjet method and a gravure printing method.

When comparing the two types of organic EL elements, vapor deposition-type organic EL elements have gained more popularity up to this point, for reasons such as higher light-emitting efficiency of the light-emitting material and longer operating lifetime in comparison with application-type organic EL elements (see Patent Literatures 1 and 2, for example). As a result, vapor deposition-type organic EL elements have already been put into practical use in mobile phone displays, small-sized TVs and the like.

However, although vapor deposition-type organic EL elements may be ideal for use in small-sized organic EL panels, application thereof is extremely difficult, for example, to full-color, large-sized organic EL panels having display sizes of around 100 inches. The difficulty of such an application derives from the technology applied in the manufacturing of a vapor deposition-type organic EL element. For instance, when manufacturing an organic EL panel using vapor deposition-type organic EL elements, a mask vapor deposition method is commonly applied for separately forming light-emitting layers corresponding to each of the colors (for instance R, G, and B) to be displayed on the organic EL panel. However, as the surface area of the organic EL panel to be manufactured becomes larger, it becomes more and more difficult to maintain the precision with which mask position adjustment is performed. This is due to reasons such as the difference in thermal expansion coefficients between the mask and the glass substrate. Hence, the manufacturing of a large-sized display without any deficiencies is extremely difficult when applying vapor deposition-type organic EL elements. One possible countermeasure as to overcome such a problem is using vapor deposition-type organic EL elements having a light-emitting layer formed of white-colored material, and further providing color filters of the respective colors R, G, and B. This excludes the need for the separate application of colors, but however, such a countermeasure has a shortcoming as well. In specific, when taking such a countermeasure, the amount of light which can be actually used is a mere third of the amount of light emitted from the entire light-emitting layer, and thus, more electricity will be consumed, in principle.

As such, attempts are being made to realize the manufacturing of larger organic EL panels by using application-type organic EL elements. As already described in the above, a functional layer is formed by applying a wet process in an application-type organic EL element. In the application of the wet process, the precision with which the application of functional layer material of the respective colors to corresponding positions on the substrate is performed is not influenced by the size of the substrate. Hence, the technical barrier to be overcome in realizing the manufacturing of larger organic EL panels is not as high as in the case of vapor deposition-type organic EL elements.

At the same time, much effort is also being made in research and development of technology for enhancing the light-emitting efficiency of organic EL elements. Efficient injection of carriers (holes and electrons) from the electrodes to the functional layer is essential in causing an organic EL element to emit light with high efficiency, high luminous intensity, and low power consumption. Generally, provision of an injection layer in between each of the electrodes and the functional layer is effective in realizing efficient injection of carriers to the functional layer. This is since an injection layer has the function of lowering the energy barrier to be overcome in the injection of carriers. As a hole injection layer, which is one of the injection layers, such films as a vapor deposition film and an application film are commonly used. A vapor deposition film is composed of material such as copper phthalocyanine and molybdenum oxide, whereas an application film is composed of PEDOT or the like. Among such hole injection layers, it has been reported that a vapor deposition film composed of molybdenum oxide contributes to the improvement of hole injection efficiency, as well as to the longevity of the organic EL element (see Patent Literature 3, for example).

CITATION LIST

Patent Literature

[Patent Literature 1]
Japanese Patent Publication No. 3369615
[Patent Literature 2]
Japanese Patent Publication No. 3789991
[Patent Literature 3]
Japanese Patent Application Publication No. 2005-203339
[Patent Literature 4]
Japanese Patent Application Publication No. 2003-249375

Non-Patent Literature

[Non-Patent Literature 1]
Jingze Li et al., Synthetic Metals 151, 141 (2005)
[Non-Patent Literature 2]
Hiromi Watanabe et al., Yuki EL Tohronkai Dai 7 Kai Reikai Yokoushuu, 17 (2008)
[Non-Patent Literature 3]
Hyunbok Lee et al., Applied Physics Letters 93, 043308 (2008)
[Non-Patent Literature 4]
Kenji Koizumi et al., Dai 56 Kai Ouyou Butsurigaku Kankei Rengou Kouenkai Yokoushuu, 30p-ZA-11 (2009)
[Non-Patent Literature 5]
Yasuo Nakayama et al., Yuki EL Tohronkai Dai 7 Kai Reikai Yokoushuu, 5 (2008)

SUMMARY

However, in application-type organic EL elements having the aforementioned advantages, there is a demand for even better drive performance at a low voltage and higher luminous efficiency. Particularly, in the manufacturing of application-type organic EL elements, there is a demand for further improvement of hole injection efficiency and longevity.

In view of the above problems, one non-limiting and exemplary embodiment provides an organic EL element which has a reduced hole injection barrier between a hole injection layer and a functional layer, and which exhibits excellent hole injection efficiency. As such, the organic EL element is expected to drive in excellent state at a low voltage.

In one general aspect, the techniques disclosed here feature an organic EL element, comprising: an anode; a cathode; a functional layer that is disposed between the anode and the cathode and includes at least a light-emitting layer made of an organic material; a hole injection layer disposed between the anode and the functional layer; and a bank that defines a region in which the light-emitting layer is to be formed, wherein the hole injection layer contains tungsten oxide, includes an occupied energy level that is approximately 1.8 electron volts to approximately 3.6 electron volts lower than a lowest energy level of a valence band of the hole injection layer in terms of a binding energy, and has a recessed portion in an upper surface thereof at the region defined by the bank, the recessed portion has (i) an inner bottom surface that is in contact with a bottom surface of the functional layer, and (ii) an inner side surface that is continuous with the inner bottom surface and in contact at least with part of a side surface of the functional layer, and the inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

One aspect of the present disclosure is an organic EL element having a hole injection layer which contains tungsten oxide. Further, the hole injection layer has, in an electronic state thereof, an occupied energy level which is 1.8 eV to 3.6 eV lower than the lowest energy level of a valence band of the hole injection layer, in terms of binding energy. By the hole injection layer having such an occupied energy level, the hole injection barrier between the hole injection layer and the functional layer is suppressed to a low level. Resultantly, the organic EL element which is one aspect of the present disclosure has excellent hole injection efficiency, can be driven at a low voltage, and is expected to exhibit excellent light-emitting efficiency.

Additionally, the organic EL element, which is one aspect of the present disclosure, has a hole injection layer composed of tungsten oxide, which exhibits high chemical stability. Accordingly, the dissolution, decomposition, and degradation of the hole injection layer by alkaline solutions, water, organic solvents, etc., during a bank forming process is suppressed. Thus, the hole injection layer is able to maintain its form and its excellent hole injection efficiency throughout and after the manufacturing process of the organic EL element. This allows the manufacturing of an organic EL element which is able to withstand processing performed during the mass production of organic EL panels.

In the case where the hole injection layer is composed of tungsten oxide having the aforementioned occupied energy level, the hole injection layer suffers from a unique and new problem. Specifically, during the manufacturing process of the hole injection layer, the thickness of the hole injection layer is reduced (hereinafter, also referred to as "film thinning"). This may adversely affect the light-emitting characteristics; for example, irregular luminance in the light-emitting layer formed in the region defined by the bank, shortening of the life of the organic EL element, etc.

To address the above problem, the organic EL element according to one aspect of the present disclosure includes the hole injection layer having a recessed portion in an upper surface thereof (i.e., surface closer to the functional layer) at the region defined by the bank. Furthermore, the functional layer is formed to be in contact with the inner surface (the inner bottom surface and the side surface) of the recessed portion. This improves the wettability of the hole injection layer with respect to a functional layer material. As a result, even if the thickness of the hole injection layer is reduced, the functional layer material can still be uniformly applied, and an excellent organic EL element can be formed by high-definition patterning. This makes it possible to prevent adverse effect on the light-emitting characteristics of the organic EL element, such as irregular luminance and shortening of the life of the organic EL element.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 23A-23D are processing drawings for explaining a method of manufacturing the light emitter pertaining to Embodiment 2.

DETAILED DESCRIPTION

Figure 1:
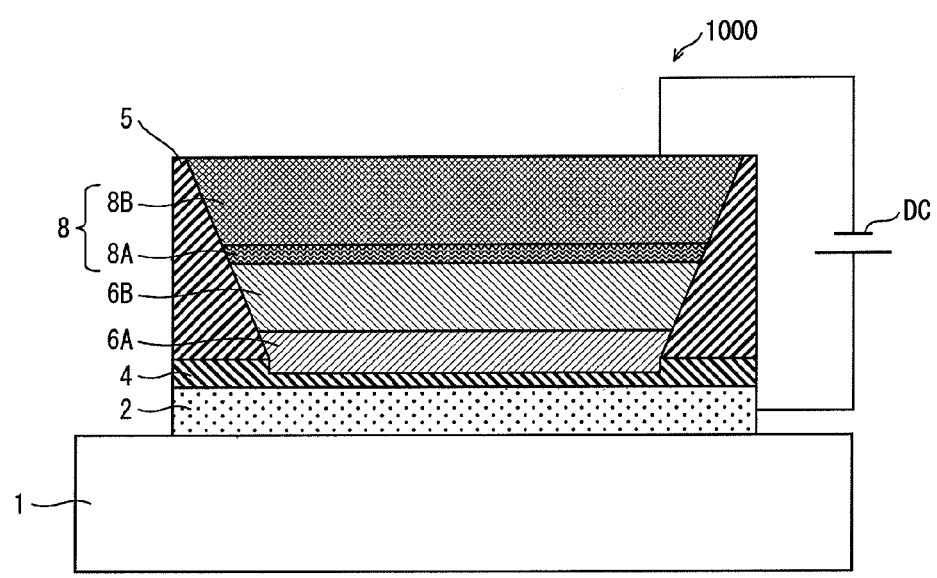
FIG. 1 is a schematic cross-sectional view illustrating a structure of an organic EL element pertaining to an embodiment.

One aspect of the present disclosure is an organic EL element, comprising: an anode; a cathode; a functional layer that is disposed between the anode and the cathode and includes at least a light-emitting layer made of an organic material; a hole injection layer disposed between the anode and the functional layer; and a bank that defines a region in which the light-emitting layer is to be formed, wherein the hole injection layer contains tungsten oxide, includes an occupied energy level that is approximately 1.8 electron volts to approximately 3.6 electron volts lower than a lowest energy level of a valence band of the hole injection layer in terms of a binding energy, and has a recessed portion in an upper surface thereof at the region defined by the bank, the recessed portion has (i) an inner bottom surface that is in contact with a bottom surface of the functional layer, and (ii) an inner side surface that is continuous with the inner bottom surface and in contact at least with part of a side surface of the functional layer, and the inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

In the organic EL element, the occupied energy level at an interface between the hole injection layer and the functional layer may be approximately equal to an energy level of a highest occupied molecular orbital of the functional layer in terms of the binding energy.

Further, a gap between the occupied energy level at an interface between the hole injection layer and the functional layer and an energy level of a highest occupied molecular orbital of the functional layer may be at most approximately 0.3 electron volts in terms of the binding energy.

In addition, an ultraviolet photoelectron spectroscopy spectrum of the hole injection layer may exhibit an upward protrusion that is approximately 1.8 electron volts to approximately 3.6 electron volts lower than the lowest energy level of the valence band in terms of the binding energy. In addition, an X-ray photoelectron spectroscopy spectrum of the hole injection layer may exhibit an upward protrusion that is approximately 1.8 electron volts to approximately 3.6 electron volts lower than the lowest energy level of the valence band in terms of the binding energy.

Furthermore, a differential spectrum obtained by differentiating an ultraviolet photoelectron spectroscopy spectrum of the hole injection layer may have a shape that is expressed by a non-exponential function throughout a range between approximately 2.0 electron volts and approximately 3.2 electron volts lower than the lowest energy level of the valence band in terms of the binding energy.

Additionally, the functional layer may comprise an amine-containing material.

Further, the light-emitting layer may emit light by recombination of electrons and holes injected to the functional layer, and the functional layer may further include one of a hole transfer layer that transfers the holes and a buffer layer that adjusts optical characteristics of the organic EL element and/or blocks electrons.

Also, the occupied energy level may be approximately 2.0 electron volts to 3.2 electron volts lower than the lowest energy level of the valence band in terms of the binding energy.

Also, the bank may be liquid-repellent, and the hole injection layer may be liquid-philic. Note that, terms "liquid-philic" and "liquid-phobic" are each used in a relative sense. As described above, the bank may be liquid-repellent at least on its surface. In contrast, the hole injection layer (i.e., charge injection transport layer) may be formed with a liquid-philic metal compound. In such a case, the surface of the charge injection transport layer is more liquid-philic than the surface of the bank, and the surface of the bank is more liquid-repellent than the surface of the charge injection transport layer. Also, the surface of the charge injection transport layer with liquid-philicity relatively has high wettability to ink, and the surface of the bank with liquid-repellency relatively has low wettability to the ink. Note that, liquid-philicity and liquid-repellency can be defined by a contact angle at which the ink meets the surface of the bank or the charge injection transport layer. For example, when the contact angle is equal to or smaller than 10°, the surface is defined to have liquid-philicity, and when the contact surface is equal to or greater than 35°, the surface is defined to have liquid-repellency.

Another aspect of the present disclosure is a display device including the organic EL element as described above.

Another aspect of the present disclosure is a manufacturing method of an organic EL element, comprising: preparing an anode; forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$; forming a bank above the tungsten oxide layer by forming a resist film including a resist material above the tungsten oxide layer and etching the resist film with a developing solution; after the formation of the bank, forming a hole injection layer by cleaning residuals of the resist film that adhere to the tungsten oxide layer with a cleaning liquid and dissolving part of the tungsten oxide layer with the cleaning liquid, the hole injection layer having a recessed portion in an upper surface thereof at a region defined by the bank, the recessed portion having an inner bottom surface and an inner side surface continuous with the inner bottom surface; forming a functional layer by coating the inner bottom surface and the inner side surface of the recessed portion of the hole injection layer with ink by ejecting drops of the ink into the region defined by the bank and drying the ink; and forming a cathode above the functional layer, wherein in the formation of the hole injection layer, the inner side surface of the recessed portion is formed to be in contact with at least part of a side surface of the functional layer and to have a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

Note that "a resist film including a resist material" refers to "a resist film that is used as a bank film and includes a resist material as a bank material".

Another aspect of the present disclosure is a manufacturing method of an organic EL element, comprising: preparing an anode; forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$; forming a bank above the tungsten oxide layer by forming a resist film including a resist material above the tungsten oxide layer and etching the resist film with a developing solution, and forming a hole injection layer by cleaning residuals of the resist film that adhere to the tungsten oxide layer with the developing solution and dissolving part of the tungsten oxide layer with the developing solution, the hole injection layer having a recessed portion in an upper surface thereof at a region defined by the bank, the recessed portion having an inner bottom surface and an inner side surface continuous with the inner bottom surface; forming a functional layer by coating the inner bottom surface and the inner side surface of the recessed portion of the hole injection layer with ink by ejecting drops of the ink into the region defined by the bank and drying the ink; and forming a cathode above the functional layer, wherein in the formation of the hole injection layer, the inner side surface of the recessed portion is formed to be in contact with at least part of a side surface of the functional layer and to have a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

In the above manufacturing method, the tungsten oxide layer may be formed such that an ultraviolet photoelectron spectroscopy spectrum of the tungsten oxide layer exhibits an upward protrusion that is approximately 1.8 electron volts to approximately 3.6 electron volts lower than a lowest energy level of a valence band of the tungsten oxide layer in terms of a binding energy.

Further, the tungsten oxide layer may be formed such that a differential spectrum obtained by differentiating an ultraviolet photoelectron spectroscopy spectrum of the tungsten oxide layer has a shape that is expressed by a non-exponential function throughout a range between approximately 2.0 electron volts and approximately 3.2 electron volts lower than a lowest energy level of a valence band of the tungsten oxide layer in terms of a binding energy.

In the following, description is provided on an organic EL element pertaining to an embodiment of the present disclosure. Subsequently, results and observations will be presented for each of the experiments having been performed to assess the efficiency of the present disclosure.

It is to be noted that, in each of the accompanying figures, the relation between sizes of each of the members are not illustrated directly reflecting the actual relation.

Embodiment 1

Structure of Organic EL Element

FIG. 1 is a schematic cross-sectional view illustrating the structure of an organic EL element 1000 pertaining to the embodiment.

The organic EL element 1000 includes: a hole injection layer 4; various functional layers (a buffer layer 6A and a light-emitting layer 6B, in this case); and a pair of electrodes composed of an anode 2 and a cathode 8. The hole injection layer 4 and the functional layers are disposed one on top of the other, and are disposed between the pair of electrodes. Each of the functional layers contains organic material having a predetermined function.

More specifically, the organic EL element 1000 includes, as illustrated in FIG. 1, the anode 2, the hole injection layer 4, the buffer layer 6A, the light-emitting layer 6B, and the cathode 8 (composed of a barium layer 8A and an aluminum layer 8B), which are disposed in the stated order on one main surface of a substrate 1.

The substrate 1 is formed with an insulating material such as soda glass, nonfluorescent glass, phosphate glass, borate glass, quartz, acrylic resin, styrenic resin, polycarbonate resin, epoxy resin, polyethylene, polyester, silicone resin, alumina, etc. Predetermined TFT wiring is formed on one surface of the substrate 1.

The anode 2 can be formed with APC (alloy of silver, palladium, and copper), ARA (alloy of silver, rubidium, and gold), MoCr (alloy of molybdenum and chromium), NiCr (alloy of nickel and chromium), etc. In the case of a top emission type light emitter, the anode 2 may be formed with a light-reflective material, for example.

(Hole Injection Layer)

The hole injection layer 4 is composed of a 30 nm-thick tungsten oxide thin film (layer). In the composition formula (WOx) denoting the composition of tungsten oxide, x is a real number existing within a range of approximately 2<x<3.

Concerning the hole injection layer 4, it may be preferable, for example, that the hole injection layer 4 consists of only tungsten oxide. However, the inclusion of a trace level of impurities is acceptable, provided that the amount does not exceed the amount of impurities which may be incorporated as a result of normal processing.

Here, the hole injection layer 4 is formed under specific conditions. It is by forming the hole injection layer 4 under such specific conditions that the hole injection layer 4 is provided, in an electronic state thereof, with an occupied energy level which is 1.8 eV to 3.6 eV lower than the lowest energy level of a valence band of the hole injection layer, in terms of binding energy. Furthermore, the occupied energy level corresponds to the energy level of the highest occupied molecular orbital (HOMO) of the hole injection layer 4. That is, in the electronic state of the hole injection layer 4, the occupied energy level is closest to the Fermi surface of the hole injection layer 4, in terms of binding energy. As such, the occupied energy level of the hole injection layer 4 is referred to as "the occupied energy level near the Fermi surface" in the following description.

The existence of the occupied energy level near the Fermi surface results in a so-called interface energy level alignment being formed at an interface between the hole injection layer 4 and the functional layer (the buffer layer 6A, in this case). By the interface energy level alignment being formed, the energy level of the HOMO of the buffer layer 6A substantially equals the occupied energy level near the Fermi surface of the hole injection layer 4, in terms of binding energy.

Note that the expressions "substantially equals" and "interface energy level alignment being formed" as referred to herein indicate a state where a gap between the lowest occupied energy level near the Fermi surface of the hole injection layer 4 and the lowest energy level of the HOMO of the buffer layer 6A, at an interface between the hole injection layer 4 and the buffer layer 6A, is equal to or less than 0.3 eV in terms of binding energy.

Furthermore, the expression "interface" as referred to herein denotes an area which includes a surface of the hole injection layer 4 facing the buffer layer 6A, and a portion of the buffer layer 6A which is within 0.3 nm in distance from the surface of the hole injection layer 4 facing the buffer layer 6A.

Concerning the occupied energy level, it may be preferable, for example, that the occupied energy level near the Fermi surface is provided to all portions of the hole injection layer 4. However, the present invention is not limited to this. Other cases are included within the scope of the present invention, as long as the occupied energy level near the Fermi surface is provided at least at the interface between the hole injection layer 4 and the buffer layer 6A.

(Banks)

On the surface of the hole injection layer 4, banks 5 made of an insulating material are formed. The banks 5 are disposed such that each of the banks has a uniform trapezoidal cross-section, and such that the banks form either a line bank structure or a pixel bank structure on the surface of the hole injection layer 4. The banks 5 are formed with an organic material such as resin or an inorganic material such as glass. Examples of the organic material include acrylic resin, polyimide resin, novolac-type phenolic resin, etc. Examples of the inorganic material include silicon oxide ($SiO_2$), silicon nitride ($Si_3N_4$), etc. It may be preferable, for example, that the banks 5 have organic solvent resistance, and have certain light transparency to visible light. Furthermore, since the banks 5 may be etched, baked, etc. when formed, it may be preferable, for example, that the banks 5 are formed with a material highly resistant to the etching and baking processes. By the provision of the banks 5, the surface of the hole injection layer 4 is divided into a plurality of sections. At each of the sections on the surface of the hole injection layer 4, a functional layer is formed. The functional layer includes the buffer layer 6A, and the light-emitting layer 6B of a corresponding color among the colors of R, G, and B. As is illustrated in FIG. 1, when applying the organic EL element 1000 to an organic EL panel, a plurality of units (pixels) of organic EL elements 1000 are disposed in parallel on the surface of the substrate 1. More specifically, each unit, or pixel, is a series of three organic EL elements 1000, and each of the three organic EL elements 1000 in a pixel is allocated to a corresponding one of the colors R, G, and B.

Here, it should be noted that the banks 5 are not essential to the present disclosure, and when the organic EL element 1000 is to be used alone, the banks need not be formed.

(Buffer Layer)

The buffer layer 6A is a 20 nm-thick layer composed of TFB (poly(9,9-di-n-octylfluorene-alt-(1,4-phenylene-((4-sec-butylphenyl)imino)-1, 4-phenylene)), which is an amine-containing organic polymer.

(Light-Emitting Layer)

The light-emitting layer 6B is a 70 nm-thick layer of F8BT (poly(9,9-di-n-octylfluorene-alt-benzothiadiazole)), which is an organic polymer. However, the material to be used in forming the light-emitting layer 6B is not limited to this, and the light-emitting layer 6B may include a commonly-known organic material. Examples of such commonly-known organic material for the light-emitting layer 6B include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488. When the light-emitting layer 6B includes a layer formed with a high-polymer material, the light-emitting layer 6B can be formed by a printing technology such as an ink-jet method, and a nozzle coating method. Accordingly, compared with a deposition method using a low-molecular material, is it possible to easily contribute to cost reduction.

(Functional Layer)

The functional layer of the present disclosure is either one of, a combination of more than two of, or all of layers such as a hole transfer layer, a light-emitting layer, and a buffer layer. The hole transfer layer transfers holes, the light-emitting layer emits light as a result of recombination of holes and electrons which are injected thereto, and the buffer layer is used for adjusting optical characteristics of the organic EL element 1000 or for blocking electrons. Although the target of the present disclosure is the hole injection layer, an organic EL element commonly includes layers having each of the functions of the above-described hole transfer layer, light-emitting layer and the like, in addition to the hole injection layer. As such, the expression "functional layer" in the embodiment refers to all such layers which need to be included in the organic EL element, in addition to the hole injection layer.

(Electrodes, Substrate, etc.)

The cathode 8 includes a 5 nm-thick barium layer 8A and a 100 nm-thick aluminum layer 8B, which are disposed one on top of the other.

The anode 2 and the cathode 8 are connected to a power supply DC, whereby the organic EL element 1000 is supplied with power from the outside.

The substrate 1 may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

(Effects and Advantages Produced by the Organic EL Element)

As described in the above, the organic EL element 1000 includes the hole injection layer 4 having the occupied energy level near the Fermi surface. Thus, the hole injection barrier between the hole injection layer 4 and the buffer layer 6A is lowered. Hence, when voltage is applied to the organic El element 1000 during driving thereof, holes are injected smoothly, and at a low voltage, from the occupied energy level near the Fermi surface of the hole injection layer 4 to the HOMO of the buffer layer 6A. As a result, the organic EL element 1000 of the present disclosure exhibits excellent hole injection efficiency.

Note that there has been a report made of the technology of applying tungsten oxide as the material of the hole injection layer (see Non-Patent Literature 1). However, the hole injection layer as obtained in Non-Patent Literature 1 has an exemplary thickness of approximately 0.5 nm, and the voltage-electric current characteristics of the hole injection layer depends largely on film thickness. Thus, the hole injection layer of Non-Patent Literature 1 does not exhibit a level of practicality which enables application thereof to the mass production of large-sized organic EL panels. Furthermore, Non-Patent Literature 1 does not suggest forming the occupied energy level near the Fermi surface in the hole injection layer in a constructive manner. Hence, it is concluded that the present disclosure largely differs from conventional technology. The present disclosure is characterized in that a predetermined occupied energy level near the Fermi surface is provided to a chemically-stable hole injection layer that is composed of tungsten oxide and that withstands processing during mass production of large-sized organic EL panels. This provides the hole injection layer with excellent hole injection efficiency, and enables the organic EL element to be driven at a low voltage.

In the following, description is provided of an example of an overall method of manufacturing the organic EL element 1000.

(Manufacturing Method of the Organic EL Element)

Firstly, the substrate 1 is mounted inside a chamber of a sputtering film-forming device. Then, a predetermined sputtering gas is introduced into the chamber, and the 50 nm-thick anode 2 composed of ITO is formed according to the reactive sputtering method.

The forming of the hole injection layer 4 is performed subsequently. Here, it may be preferable, for example, that the hole injection layer 4 is formed similarly according to the reactive sputtering method. Especially, in a case where the organic EL element of the present disclosure is to be applied to a large-sized organic EL panel, the hole injection layer needs to be formed over a large area. In such a case, the forming of the hole injection layer according to the vapor deposition method is problematic in that there is a risk that unevenness may occur in terms of film thickness, etc. The occurrence of such unevenness can be readily prevented by forming the hole injection layer 4 according to the reactive sputtering method.

More specifically, the reactive sputtering method is performed after replacing the previous sputtering target with metal tungsten. Further, argon gas and oxygen gas are respectively introduced into the chamber as the sputtering gas and the reactive gas. Under this condition, the argon in the argon gas is ionized by the application of high voltage, and the ionized argon is caused to bombard the sputtering target. The metal tungsten ejected as a result of the sputtering phenomenon reacts with the oxygen gas, and produces tungsten oxide. As a result, the "sputtered" tungsten oxide forms a film on the anode 2 of the substrate 1.

Note that in the forming of the hole injection layer 4, it may be preferable, for example, that the tungsten oxide film is formed under conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$. By forming the hole injection layer 4 under such conditions, the hole injection layer 4 having an occupied energy level which is 1.8 eV to 3.6 eV lower than the lowest energy level of a valence band of the hole injection layer 4, in terms of binding energy, is yielded.

Subsequently, as the material for forming the banks 5, photosensitive resin material or, more preferably, photoresist material containing fluorine material is to be prepared. In order to form the banks 5, first, the bank material so prepared is uniformly applied on the hole injection layer 4. After performing prebaking, a mask having an aperture of a predetermined shape (a pattern of the banks 5 to be formed) is placed over the prebaked bank material. After exposing the bank material to light from over the mask, unhardened, redundant bank material is removed by using a developer. Finally, by performing rinsing with pure water, the banks 5 are yielded.

Here, it should be noted that in the present embodiment, the hole injection layer 4 is composed of tungsten oxide. Tungsten oxide has resistance with respect to dissolution, decomposition, and degradation by alkaline solutions, water, organic solvents, etc. For this resistance, even when the hole injection layer 4 having been formed falls into contact with such solutions, pure water, etc. in the subsequent bank forming process, damage to the hole injection layer 4, by dissolution, decomposition, degradation and the like, is prevented. Thus, the hole injection layer 4 maintains an appropriate form thereof at the completion of the manufacturing of the organic EL element 1000. This too, in addition to the above-described characteristics of the present disclosure, enables the efficient injection of holes to the buffer layer 6A via the hole injection layer 4, and further enables the organic EL element 1000 to be driven at a low voltage.

Following this, the buffer layer 6A is formed by ejecting drops of ink composition containing amine-containing organic molecular material onto a surface of the hole injection layer 4, which is exposed from between adjacent ones of the banks 5, and removing the solvent of the ink composition by volatilization. The ejection of ink composition is performed according to a wet process, such as the inkjet method and the gravure printing method.

Following the forming of the buffer layer 6A, drops of ink composition containing organic light-emitting material is ejected onto the surface of the buffer layer 6A, and again, the solvent of the ink composition is removed by volatilization by applying a similar method as in the forming of the buffer layer 6A. Thus, the light-emitting layer 6B is formed.

Here, it should be noted that the method applied for forming the buffer layer 6A and the light-emitting layer 6B is not limited to the above-described method. Other commonly-known methods besides the inkjet method and the gravure printing method may be applied for the ejection/application of ink. Such commonly-known methods include: the dispenser method; the nozzle coating method; the spin coating method; the intaglio printing method; the relief printing method and the like. Subsequently, the barium layer 8A and the aluminum layer 8B are formed on a surface of the light-emitting layer 6B by applying the vacuum vapor deposition method. Thus, the cathode 8 is formed.

It should be noted that, although not illustrated in FIG. 1, a sealing layer may be additionally provided on the surface of the cathode 8, or a sealing cap may be provided to isolate the entire organic EL element 1000 from external space, in order to prevent atmospheric exposure of the organic EL element 1000. The sealing layer may be formed, for instance, by using materials such as SiN (silicon nitride) and SiON (silicon oxynitride), and may be disposed such that the organic EL element 1000 is sealed therein. When using a sealing cap to prevent atmospheric exposure of the organic EL element 1000, the sealing cap may be formed by using, for instance, the same material as the substrate 1, and a getter which absorbs moisture and the like may be provided within the sealed space formed by the substrate 1 and the sealing cap.

By following the above-provided procedures, the manufacturing of the organic EL element 1000 is completed.

<Experiments and Observations>

(Conditions for Forming the Tungsten Oxide Layer)

In the present embodiment, the hole injection layer 4 is yielded by forming a film of tungsten oxide under predetermined conditions. The forming of the tungsten oxide film under such film forming conditions provides the hole injection layer 4 with the occupied energy level near the Fermi surface, which results in the hole injection barrier between the injection layer 4 and the buffer layer 6A being reduced. Furthermore, the organic EL element 1000 having a hole injection layer formed under such film forming conditions can be driven at a low voltage.

In order to obtain a tungsten oxide film having the above-described characteristics, a DC magnetron sputtering device is used in the forming thereof. The sputtering target is metal tungsten, and the processing is performed while not controlling substrate temperature, and by introducing argon gas and oxygen gas into the chamber of the sputtering device. In such an environment, the tungsten oxide film is formed by applying the reactive sputtering method under film forming conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$.

The effectiveness of such film forming conditions (i) through (iii) have been proved through the following experiments.

Firstly, the inventors prepared hole-only devices as assessment devices to be used in accurately determining the dependence of hole injection efficiency on the conditions under which the tungsten oxide film is formed. Needless to say, here the expression "hole injection efficiency" refers to the efficiency with which holes are injected into the buffer layer 6A from the hole injection layer 4.

Basically, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 2:
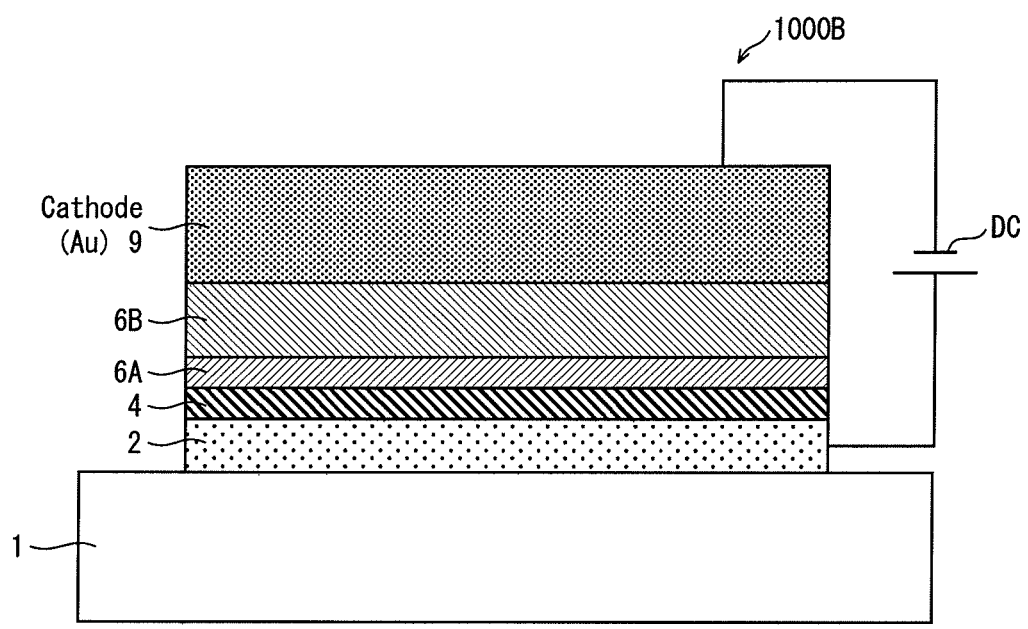
FIG. 2 is a schematic cross-sectional view illustrating a structure of a hole-only device.

In detail, the hole-only devices prepared by the inventors were actually obtained by replacing the cathode 8 of the organic EL element 1000 illustrated in FIG. 1 with gold (Au) to form a cathode 9 as illustrated in FIG. 2. That is, the inventors obtained the hole-only device illustrated in FIG. 2 by forming a 50 nm-thick anode 2 composed of an ITO thin film on the substrate 1, and further disposing, on the anode 2 so formed, the following layers in the order in which they are introduced: a 30 nm-thick hole injection layer 4 composed of tungsten oxide; a 20 nm-thick buffer layer 6A composed of TFB, which is an amine-containing organic polymer; a 70 nm-thick light-emitting layer 6B composed of F8BT, which is an organic polymer; and a 100 nm-thick cathode 9 composed of gold. Note that, considering that the hole-only devices are devices prepared for the sole sake of assessment, the banks 5 included in the structure of the organic EL element 1000 are omitted from the structure of the hole-only devices.

In the manufacturing of the hole-only devices, the hole injection layers 4 of the hole-only devices were similarly formed by applying the reactive sputtering method in a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Further, in order to obtain the hole-only devices, changes were made to certain film forming conditions, namely total gas pressure, oxygen partial pressure, and input power, as illustrated in Table 1. As a result, hole-only devices 1000B (devices No. 1 through No. 14), each having a hole injection layer 4 formed under different film forming conditions, were obtained. Note that, hereinafter, oxygen partial pressure is indicated as a ratio (%) with respect to the total pressure of the gases in the chamber of the sputtering device.

TABLE 2

| Input Power (W) | Input Power Density (W/cm$^2$) |
|---|---|
| 250 | 1.4 |
| 500 | 2.8 |
| 1000 | 5.6 |

Following the completion of the preparation of the hole-only devices 1000B, the inventors connected each of the hole-only devices 1000B to the direct current power supply DC, and applied voltage thereto. Further, the inventors obtained an electric current value per unit surface area (current density) for each of the hole-only devices 1000B. More specifically, the voltage applied to the hole-only devices was changed, and a value indicating electric current flowing was obtained at different voltages. Further, conversion was performed on the electric current values to obtain an electric current density value of the hole-only devices 1000B. Note that hereinafter, the expression "driving voltage" refers to different voltages applied to the hole-only devices 1000B when the current density value is 10 mA/cm$^2$.

In short, it could be said that the smaller the driving voltage, the higher the hole injection efficiency of the hole injection layer 4. This is since, the members composing the hole-only devices 1000B, other than the hole injection layer 4, are prepared according to the same manufacturing method, and thus, it could be assumed that the hole injection barrier between two adjacent layers, other than the hole injection layer 4, is uniform in each of the hole-only devices 1000B. In addition, it has been confirmed through another experiment that the anode 2 and the hole injection layer 4 in each of the hole-only devices 1000B used in this experiment are in ohmic contact. Considering the above, it could be expected that the differences in driving voltage of the hole-only devices 1000B resulting from the different film forming conditions strongly

TABLE 1

Film Forming Conditions of the Hole-only Devices 1000B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

reflect the hole injection efficiency from the hole injection layer 4 to the buffer layer 6A in each of the hole-only devices 1000B.

Table 3 illustrates each of the hole-only devices 1000B and a driving voltage thereof. Further, the hole only devices are classified in Table 3 according to the film forming conditions under which the hole injection layer 4 of each of the hole-only devices 1000B was formed. More specifically, classification is made according to the film forming conditions of: total pressure; oxygen partial pressure; and input power. Note that the numbers enclosed in circles in Table 3 indicate the device number of each of the hole-only devices 1000B.

TABLE 3

Film Forming Conditions and Driving Voltages of the Hole-only Devices 1000B
(Applied Voltage Value under Electric Current Density of 10 mA/cm$^2$)

| | | Total Pressure | | |
| --- | --- | --- | --- | --- |
| | | 1.7 Pa | 2.7 Pa | 4.8 Pa |
| Oxygen Partial Pressure | 30% | ⑫ 500 W (Unmeasured) | ⑬ 500 W (19 V) | Film could not be formed |
| | 50% | ④ 500 W (19 V) | ⑩ 500 W (19 V) | ⑭ 250 W (13.7 V) ② 500 W (13.7 V) ⑧ 1000 W (>20 V) |
| | 70% | ⑪ 500 W (Unmeasured) | ⑤ 250 W (14.7 V) ① 500 W (18.2 V) ⑦ 1000 W (>20 V) | Film could not be formed |
| | 100% | ⑥ 250 W (Unmeasured) ③ 500 W (>20 V) ⑨ 1000 W (>20 V) | Film could not be formed | Film could not be formed |

*Numbers enclosed in circles indicate device No., numbers without parenthesis indicate input electricity, and numbers placed in parenthesis indicate driving voltage.

Figures 3A, 3B, 3C:
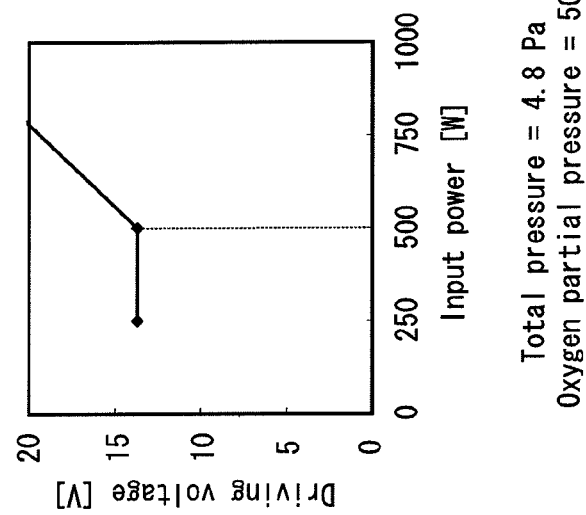
FIGS. 3A through 3C are graphs illustrating a dependence of driving voltage of hole-only devices on film forming conditions of a hole injection layer.

Further, FIGS. 3A through 3C are graphs illustrating the dependence of driving voltages of the hole-only devices 1000B on the film forming conditions. The points in FIG. 3A indicate, from left to right in the figure, the driving voltages of the devices No. 4, 10, and 2. Similarly, the points in FIG. 3B indicate, from left to right in the figure, the driving voltages of the devices No. 13, 10, and 1. Finally, the points in FIG. 3C indicate, from left to right in the figure, the driving voltages of the devices No. 14, 2, and 8.

Here, it should be noted that under the following conditions (i) through (iv), the forming of the hole injection layer 4 was not successfully performed due to limitations of the sputtering device, such as gas flow amount. In specific, the hole injection layer 4 was not formed when: (i) total pressure was 2.7 Pa and oxygen partial pressure ratio was 100%; (ii) total pressure was 4.8 Pa and oxygen partial pressure ratio was 30%; (iii) total pressure was 4.8 Pa and oxygen partial pressure ratio was 70%; and (iv) total pressure was 4.8 Pa and oxygen partial pressure ratio was 100%.

Firstly, concerning the dependence of driving voltage on total pressure, under the condition that the oxygen partial pressure ratio was set to 50% and the input power was set to 500 W, a clear reduction in a driving voltage was observed at least when the total pressure was set higher than 2.7 Pa and lower than or equal to 4.8 Pa, as illustrated in FIG. 3A. In addition, as a result of a different experiment, it was found that this trend of reduction in driving voltage continues at least until the total pressure is lower than or equal to 7.0 Pa. Taking this into account, it may be preferable, for example, that total pressure during the forming of the hole injection layer 4 is set higher than 2.7 Pa and lower than or equal to 7.0 Pa.

Next, concerning the dependence of driving voltage on oxygen partial pressure ratio, under the condition that the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 3B. However, as a result of a different experiment, it was found that when the oxygen partial pressure ratio exceeds this range, the driving voltage begins to increase adversely. Taking this into account, it may be preferable, for example, that oxygen partial pressure ratio during the forming of the hole injection layer 4 is set higher than or equal to 50%, while setting the upper limit at approximately 70%.

Finally, concerning the dependence of driving voltage on input power, under the condition that total pressure was set to 4.8 Pa and oxygen partial pressure ratio was set to 50%, a rapid increase in driving voltage was observed when the input power exceeded 500 W, as illustrated in FIG. 3C. Taking this into account, it may be preferable, for example, that input power is restricted to be lower than or equal to 500 W. Here, it should be noted that, when referring to devices No. 1 and No. 3 in Table 3, it could be seen that, even when the input power was set to 500 W, driving voltage increased when the total pressure was set lower than or equal to 2.7 Pa.

Figure 4:
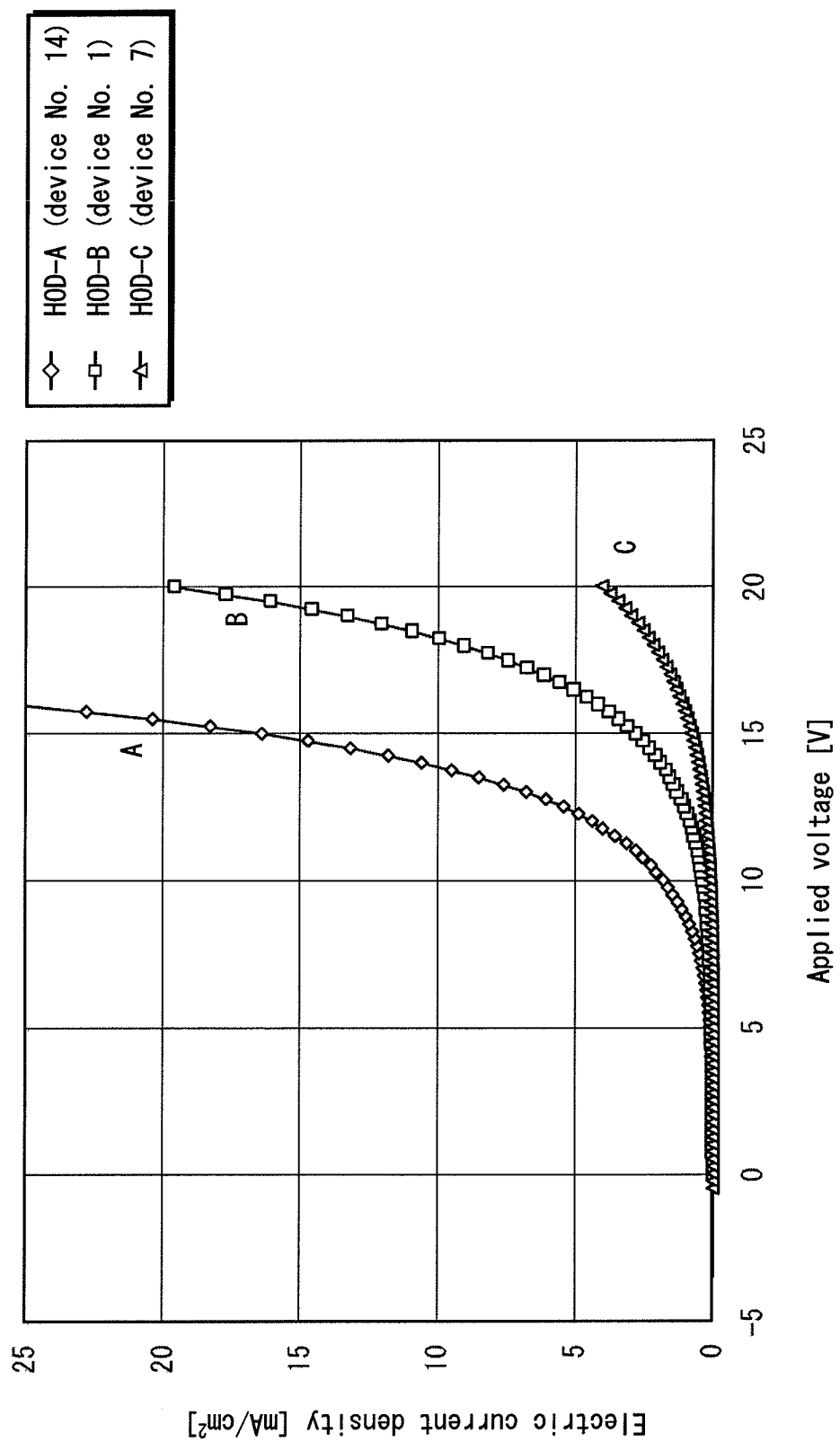
FIG. 4 is a device characteristics diagram showing a relation curve illustrating a relation between applied voltage and electric current density of the hole-only devices.

The subsequent FIG. 4 illustrates an electric current density-applied voltage curve of the hole-only devices 1000B, taking the devices No. 14, No. 1, and No. 7 as examples. In FIG. 4, the vertical axis indicates electric current density (mA/cm$^2$), whereas the horizontal axis indicates applied voltage (V). Furthermore, the device No. 14 fulfills all desirable film forming conditions explained in the above of total pressure, oxygen partial pressure, and input power, while on the other hand, each of the devices No. 1 and No. 7 does not fulfill at least one of the desirable film forming conditions.

Concerning the film forming conditions under which the hole injection layer 4 (and the later-described tungsten oxide layer 80) was formed, in order to facilitate the explanations to be provided in the following, hereinafter, the film forming conditions under which the hole injection layer 4 was formed in the device No. 14 is referred to as film forming conditions A, the film forming conditions under which the hole injection layer 4 was formed in the device No. 1 is referred to as film forming conditions B, and the film forming conditions under which the hole injection layer 3 was formed in the device No. 7 is referred to as film forming conditions C. In addition, the devices No. 14, No. 1, and No. 7 are respectively illustrated as HOD-A, HOD-B, and HOD-C in FIG. 4 and Table 3.

As illustrated in FIG. 4, the electric current density-applied voltage curve indicates that HOD-A has a higher degree of responsiveness to an increase in applied voltage compared with HOD-B and HOD-C. Further, it could be seen that HOD-A requires the lowest level of applied voltage to reach a high electric current density compared with HOD-B and HOD-C. From this, it is obvious that HOD-A has a high degree of hole injection efficiency compared with HOD-B and HOD-C. Here, it should be noted that HOD-A operates at the lowest driving voltage among the hole-only devices 1000B.

In the above, observation has been made of the hole injection efficiency of the hole injection layer 4 in each of the hole-only devices 1000B. However, here it should be emphasized that the hole-only devices 1000B and the organic EL element 1000 illustrated in FIG. 1 have nearly the same structure, differing only in the cathodes included therein. Therefore, the dependence of the hole injection efficiency from the hole injection layer 4 to the buffer layer 6A on the film forming conditions under which the hole injection layer 4 is formed is basically the same in the organic EL element 1000 and in the hole-only devices 1000B. In order to confirm the existence of such a similar dependence on the film forming conditions under which the hole injection layer 4 is formed, the inventors prepared three separate organic EL elements 1000, each having a hole injection layer 4 formed under a corresponding one of film forming conditions A, film forming conditions B, and film forming conditions C.

More specifically, the inventors prepared the organic EL elements 1000 illustrated in FIG. 1 by forming a 50 nm-thick anode 2 composed of an ITO thin film on the substrate 1, and further disposing, on the anode 2 so formed, the following layers in the order in which they are introduced: a 30 nm-thick hole injection layer 4 composed of tungsten oxide; a 20 nm-thick buffer layer 6A composed of TFB, which is an amine-containing organic polymer; a 70 nm-thick light-emitting layer 6B composed of F8BT, which is an organic polymer; and a cathode 8 composed of a 5 nm-thick barium layer and a 100 nm-thick aluminum layer. Note that, considering that the organic EL elements 1000 are assessment devices, the banks 5 were omitted from the structure thereof.

Figure 5:
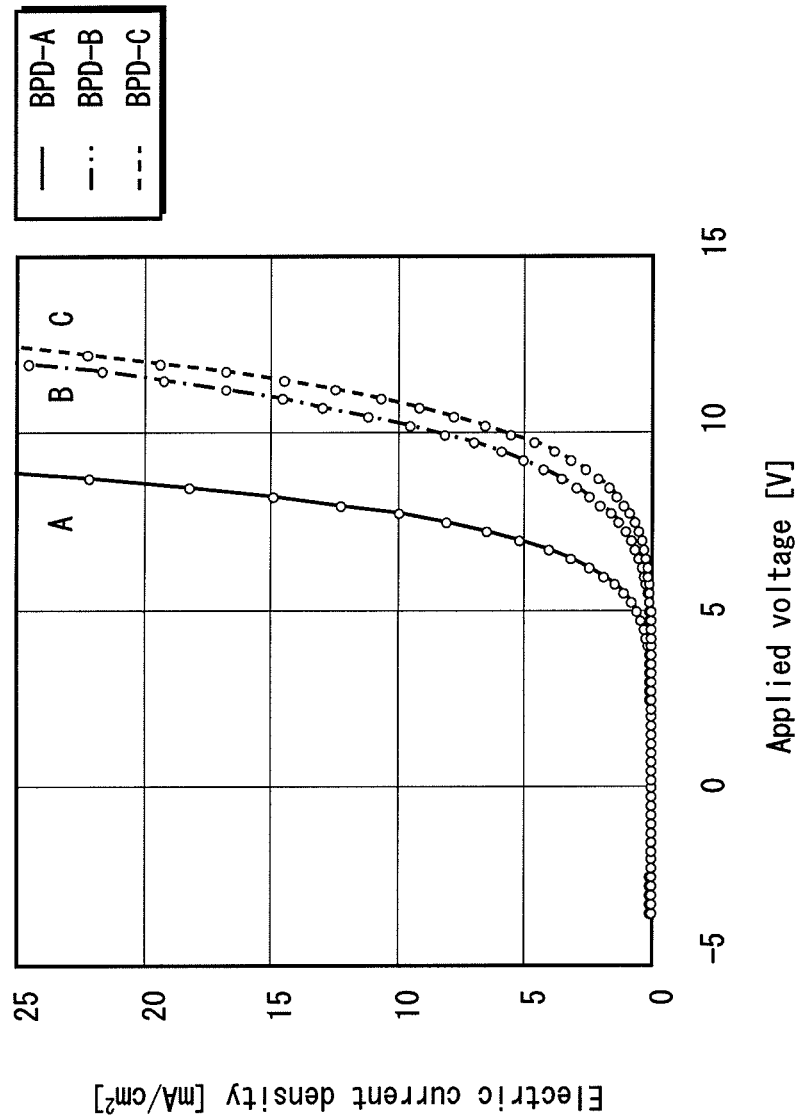
FIG. 5 is a device characteristics diagram showing a relation curve illustrating a relation between applied voltage and electric current density of organic EL elements prepared by the inventors.

The inventors connected the organic EL devices 1000 prepared under the corresponding one of the film forming conditions A, B, and C to the direct current power supply DC, and applied voltage thereto. FIG. 5 illustrates an electric current density-applied voltage curve indicating the relation between the electric current density value and the applied voltage. More specifically, the inventors obtained an electric current value per unit surface area (electric current density) for each of the organic EL elements 1000 by changing the voltage applied to the organic EL elements 1000, obtaining a value indicating electric current flowing at different voltages, and converting the electric current value into the electric current density value. In FIG. 5, the vertical axis indicates electric current density (mA/cm$^2$), whereas the horizontal axis indicates applied voltage (V).

Note that, in order to facilitate the explanations to be made in the following, the organic El elements 1000 prepared under film forming conditions A, B, and C are respectively illustrated as BPD-A, BPD-B, and BPD-C in FIG. 5.

As illustrated in FIG. 5, the electric current density-applied voltage curve indicates that BPD-A has a high degree of responsiveness to an increase in applied voltage compared with BPD-B and BPD-C. Further, it could be seen that BPD-A requires the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 6:
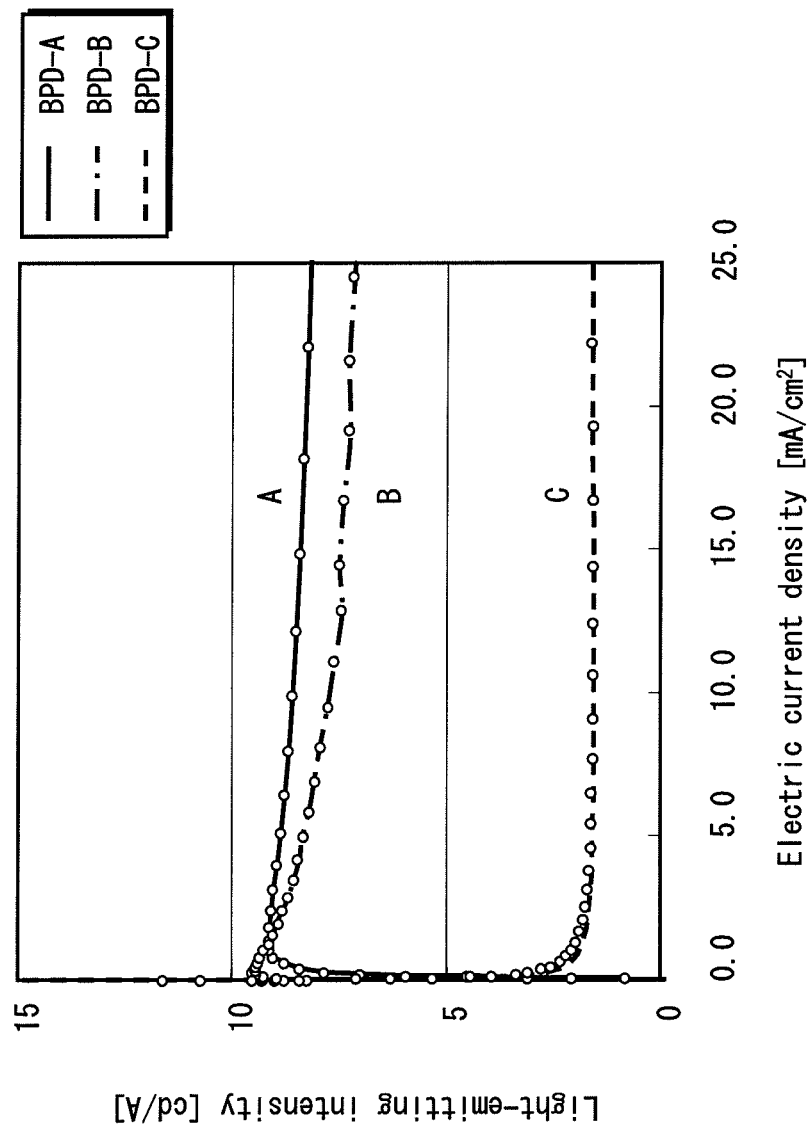
FIG. 6 is a device characteristics diagram showing a relation curve illustrating a relation between electric current density and light-emitting intensity of the organic EL elements prepared by the inventors.

In addition, FIG. 6 illustrates light-emitting intensity-electric current density curves corresponding to the organic EL elements 1000 prepared in the above. Each light-emitting intensity-electric current density curve indicates the relation between the change in electric current density and the resultant change in light-emitting intensity of the corresponding organic EL element 1000. In FIG. 6, the vertical axis indicates light-emitting intensity (cd/A), whereas the horizontal axis indicates electric current density (mA/cm$^2$). According to FIG. 6, it can be seen that BPD-A has the highest light-emitting intensity among the three organic EL elements 1000, at least within the range of electric current density that was measured in the experiment.

From the above results, it was confirmed that, concerning the organic EL elements 1000, the hole injection efficiency of the hole injection layer 4 depends on the film forming conditions, similar as in the case of the hole-only devices 1000B. That is, suppose that: the tungsten oxide film composing the hole injection layer 4 is formed by using metal tungsten as the sputtering target in a DC magnetron sputtering device by applying the reactive sputtering method; during the formation of the tungsten oxide film, no control is performed with respect to substrate temperature; and the chamber gas used is composed of argon gas and oxygen gas. In this case, a hole injection layer having the highest hole injection efficiency with respect to the buffer layer 6A was produced under film forming conditions where: (i) total pressure is higher than 2.7 Pa and lower than or equal to 7.0 Pa; (ii) oxygen partial pressure ratio is higher than or equal to 50% and lower than or equal to 70%; and (iii) input power density is higher than or equal to 1 W/cm$^2$ and lower than or equal to 2.8 W/cm$^2$. Thus, it was confirmed that the hole injection layer 4 formed while fulfilling such exemplary film forming conditions (i), (ii), and (iii) realizes both low voltage drive and high light-emitting efficiency.

Note that in the above, the film forming condition (iii) concerning input power is indicated in terms of input power density by referring to Table 2. In addition, when using a DC magnetron sputtering device that is different from the DC magnetron sputtering device used in the present experiment, the hole injection layer 4 composed of tungsten oxide having a high hole injection efficiency can be similarly yielded by adjusting input power according to the size of the sputtering target. The adjustment of input power should be performed such that the input power density fulfills condition (iii) above. Concerning the other conditions (i) and (ii), total pressure and oxygen partial pressure should each be set within the above-provided range, regardless of the device to be used and the size of the sputtering target.

Additionally, as already explained in the above, no intentional adjustment of the substrate temperature was performed while forming the hole injection layer 4 by applying the reactive sputtering method. And during the experiment, the sputtering device was placed under room temperature. Therefore, the substrate was at room temperature at least before the forming of the hole injection layer 4. However, during the formation of the hole injection layer 4, there is a possibility that the substrate temperature may rise by several tens of degrees Celsius.

Furthermore, the organic EL element 1000 having the hole injection layer 4 formed under film forming conditions A corresponds to the organic EL element 1000 in the present embodiment, which has the occupied energy level near the Fermi surface. Detailed observation is to be made regarding this point in the following.

(Electronic State of the Hole Injection Layer)

The tungsten oxide composing the hole injection layer 4 of the organic EL element 1000 pertaining to the present embodiment has the occupied energy level near the Fermi surface. The occupied energy level near the Fermi surface is formed by adjusting the film forming conditions under which the hole injection layer 4 is formed as description has been provided in the above. Details concerning this point are provided in the following.

The inventors conducted an experiment to determine whether the occupied energy level near the Fermi surface exists in each of the tungsten oxide films formed under a corresponding one of film forming conditions A, B, and C.

Figure 7:
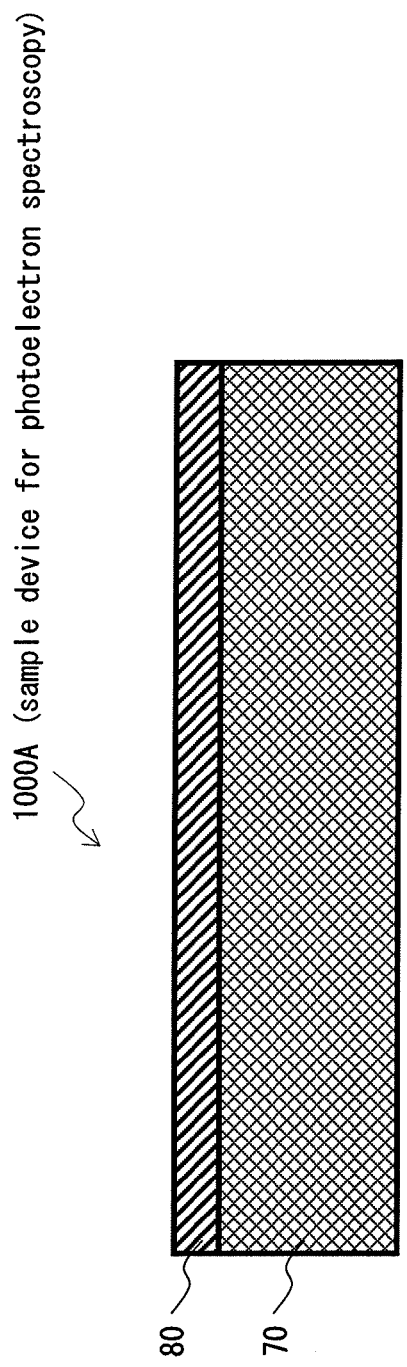
FIG. 7 is a schematic cross-sectional view illustrating a structure of a sample device which is used for photoelectron spectroscopy measurement.

The inventors prepared sample devices to be subjected to photoelectron spectroscopy measurement. Each of the sample devices was prepared under a corresponding one of the film forming conditions A, B, and C. In detail, each of the sample devices was prepared by forming a 10 nm-thick tungsten oxide layer 80 (corresponding to the hole injection layer 4) on a conductive silicon substrate 70 by applying the reactive sputtering method as described in the above. The reference sign 1000A in FIG. 7 indicates a sample device having such a structure. So as to facilitate explanation provided in the following, a sample device 1000A formed under film forming conditions A is hereinafter referred to as sample device A, a sample device 1000A formed under film forming conditions B is hereinafter referred to as sample device B, and a sample device 1000A formed under film forming conditions C is hereinafter referred to as sample device C.

The forming of the tungsten oxide layer 80 of each of the sample devices was performed inside a sputtering device. Then, to prevent atmospheric exposure, the sample devices A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 80 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order to observe the state of occupied energy levels at a surface portion of the tungsten oxide layer 80 by utilizing UPS measurement.

The conditions under which the UPS measurement was conducted are as follows. Here, it should be noted that, since the sample devices A, B, and C commonly include the conductive silicon substrate 70, charge-up did not occur during the UPS measurement. Further, the interval between measurement points was set to 0.05 eV.

Figure 8:
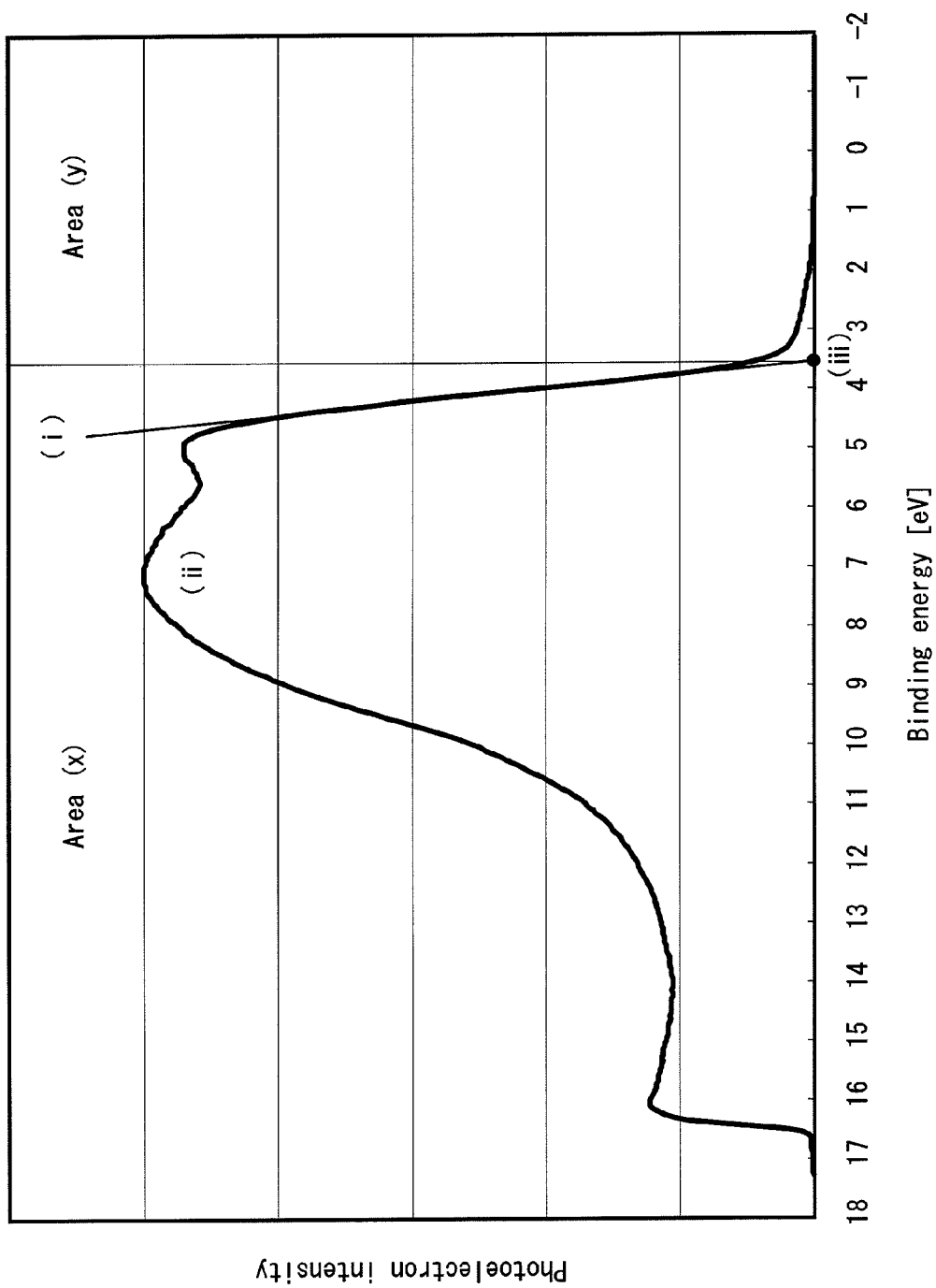
FIG. 8 illustrates a UPS spectrum of tungsten oxide.

Light source: He I line
Bias: None
Electron emission angle: Normal line direction of the substrate surface FIG. 8 illustrates a UPS spectrum of the tungsten oxide layer 80 of the sample device A. In FIG. 8, the horizontal axis indicates binding energy. The reference point on the horizontal axis corresponds to the Fermi surface of the substrate 70, and the left direction with respect to the reference point is positive, and the right direction with respect to the reference point is negative.

In the following, description is provided on each of the occupied energy levels of the tungsten oxide layer 80 with reference to FIG. 8.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area (x) that extends in the high binding energy direction departing from point (iii); and area (y) that extends in the low binding energy direction (that is, to the direction of the Fermi surface) departing from point (iii).

Here, according to Table 4, each of the sample devices A, B, and C has a tungsten oxide layer 80 whose composition ratio between tungsten atoms and oxygen atoms is approximately 1:3. The composition ratios illustrated in Table 4 were obtained by performing X-ray photoelectron spectroscopy (XPS) measurement with respect to each of the sample devices A, B, and C. More specifically, XPS measurement of the sample devices was performed by using the photoelectron spectroscopy device while preventing atmospheric exposure of the tungsten oxide layer 80 having been formed on the sample devices, in a similar way as in the conduction of the UPS measurement. By conducting the XPS measurement, the composition ratio between tungsten and oxygen within several nanometers in distance from the surface of the tungsten oxide layer 80 was estimated for each of the sample devices A, B, and C. Note that the film forming conditions under which the tungsten oxide layer 80 in each of the corresponding sample devices was formed are also illustrated in Table 4.

TABLE 4

| | Sample Device | | |
|---|---|---|---|
| | Sample Device A | Sample Device B | Sample Device C |
| | Film Forming Conditions | | |
| | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (Oxygen/Tungsten) | 3.0 | 2.9 | 2.8 |

According to the composition ratios obtained as a result of the XPS measurement, it could be assumed that in each of the sample devices A, B, and C, the tungsten oxide layer 80, at least within several nanometers in distance from the surface thereof, has a basic atomic arrangement which is in accordance with the atomic arrangement of tungsten trioxide. That is, the basic structure of the tungsten oxide layer 80 is assumed as being a structure where oxygen atoms are bound to a tungsten atom to form an octahedral coordination, and these octahedrons share oxygen atoms at corners thereof with adjacent octahedrons. Taking this into account, the area (x) in FIG. 8 indicates an occupied energy level deriving from the basic structure of the tungsten oxide layer 80 as mentioned in the above, which is the structure of the crystalline phase of tungsten trioxide or of a non-crystalline phase of tungsten trioxide, which lacks the order characteristic of the crystalline phase (note that the bond between atoms is maintained in the non-crystalline phase, and therefore the above-mentioned basic structure is preserved). Thus, the area (x) in FIG. 8 corresponds to a so-called valence band of the tungsten oxide layer 80. Note that the present inventors have performed X-ray absorption fine structure (XAFS) measurement with respect to the tungsten oxide layer 80 of each of the sample devices A, B, and C, and have confirmed that the above-mentioned basic structure is formed therein.

Accordingly, the area (y) in FIG. 8 corresponds to the band gap between the valence band and the conductive band of the tungsten oxide layer 80. Further, it is commonly known that an occupied energy level that differs from the occupied energy level of the valence band may exist in the area (y) of the tungsten oxide, as is suggested by the UPS spectrum in FIG. 8. The occupied energy level in area (y) derives from another structure that is different from the above-mentioned basic structure, and is referred to as a so-called band gap (in-gap state or gap state) energy level.

Figure 9:
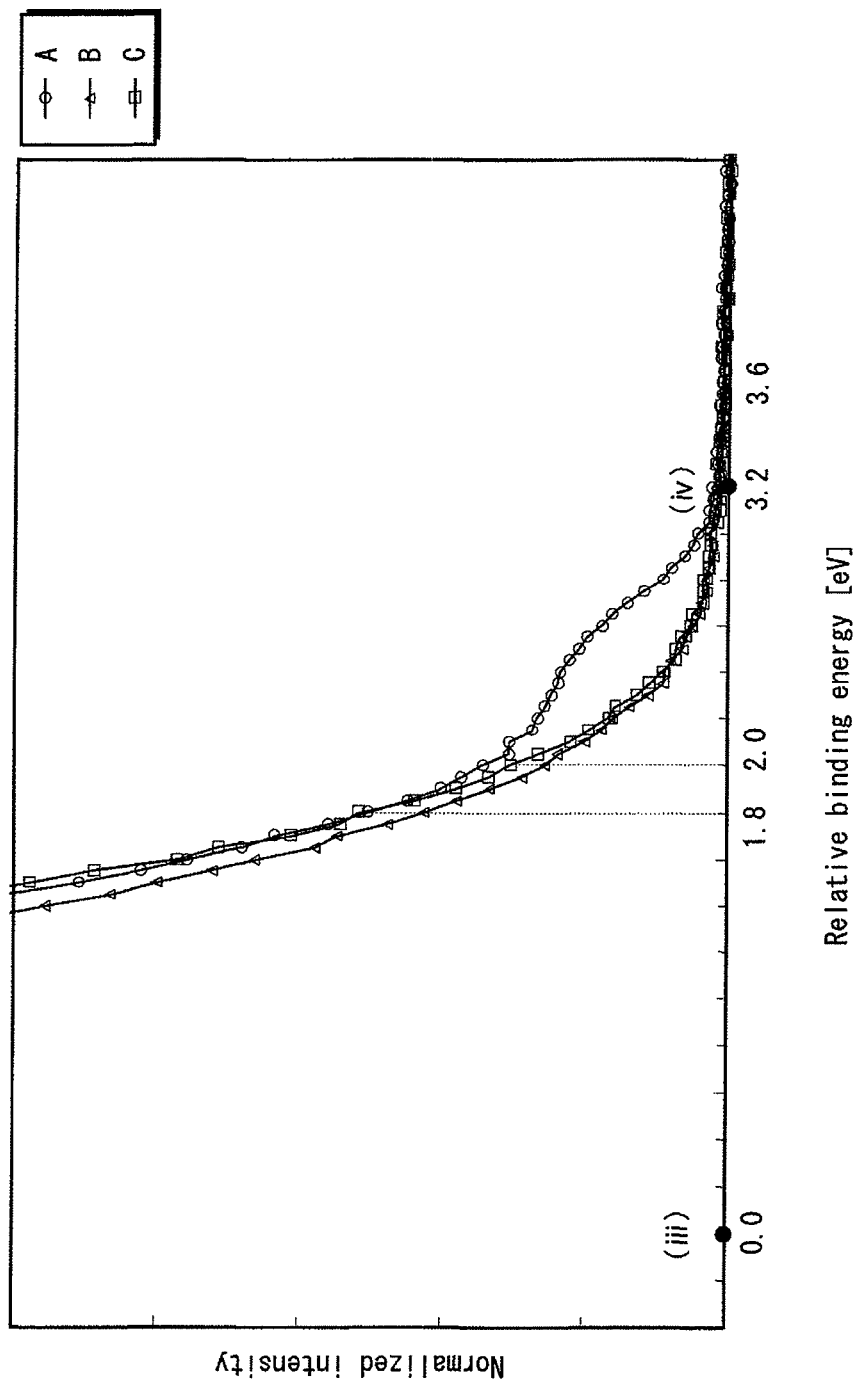
FIG. 9 illustrates UPS spectra of tungsten oxide.

The subsequent FIG. 9 illustrates a UPS spectrum of the tungsten oxide layer 80 of each of the sample devices A, B, and C, particularly within area (y) in FIG. 8. The spectrum intensity indicated by the vertical axis in FIG. 9 has been normalized using the peak-top intensity value of a peak (ii) in FIG. 8, which is located approximately 3 eV to 4 eV to the high binding energy direction from point (iii). In addition, note that point (iii) in FIG. 9 is illustrated at the same point on the horizontal axis as in FIG. 8. In FIG. 9, the horizontal axis indicates a relative value (relative binding energy) with respect to point (iii), and the binding energy decreases as the relative binding energy increases. That is, a point that is further to the right of point (iii) (or closer to the side of the Fermi surface) has a lower binding energy compared to a point which is closer to point (iii).

As illustrated in FIG. 9, the spectrum indicating the tungsten oxide layer 80 of the sample device A exhibits a peak in an area between a point which is 3.6 eV lower in terms of binding energy than point (iii) and a point which is 1.8 eV lower in terms of binding energy than point (iii). Point (iv) in FIG. 9 indicates a point at which such a peak in the spectrum indicating the tungsten oxide layer 80 of the sample device A is first obviously observed. That is, point (iv) is a point at which the peak begins. The existence of such a peak is not observed in the spectra corresponding to sample devices B and C.

The present disclosure uses, for forming the hole injection layer, tungsten oxide whose UPS spectrum indicates an upward protrusion (not necessarily a peak) in an area which is 1.8 eV to 3.6 eV lower in terms of binding energy than point (iii). Hence, the organic EL element of the present disclosure exhibits excellent hole injection efficiency.

Furthermore, it has been found that hole injection efficiency is enhanced to a greater extent when the upward protrusion exhibited in the UPS spectrum of the tungsten oxide layer 80 has a higher degree of sharpness. Therefore, it can be said that the area of the UPS spectrum which is between a point 2.0 eV lower than point (iii) and another point 3.2 eV lower than point (iii), in terms of binding energy, is particularly essential, since the upward protrusion is more prominent and has a sharper inclination compared to other areas of the UPS spectrum.

Note that, in the following description, the upward protrusion as observed in the UPS spectrum of the tungsten oxide layer 80 is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the sample devices A, B, and C indicated in FIG. 9. The differentiation was performed for the purpose of making the spectral protrusion near the Fermi surface more distinguishable.

In specific, by using the graph analysis software IGOR Pro 6.0, binomial smoothing (where smoothing factor was set to one) was conducted eleven times with respect to the UPS spectra illustrated in FIG. 9, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 10:
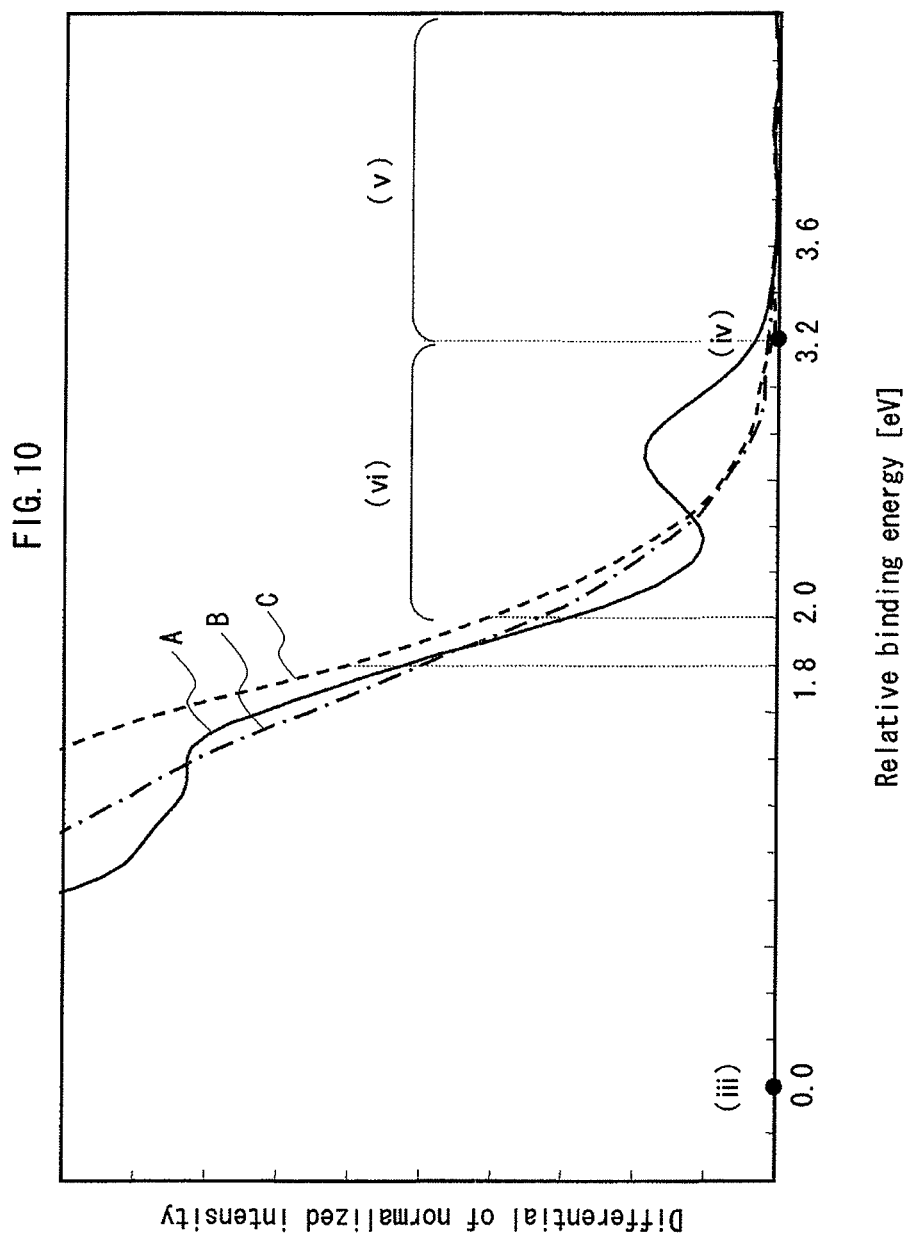
FIG. 10 illustrates differential curves corresponding to the respective UPS spectra illustrated in FIG. 9.

FIG. 10 illustrates differential curves yielded as a result of the above processing. Points (iii) and (iv) in FIG. 10 are provided at the same points on the horizontal axis as the respective points (iii) and (iv) in FIG. 9.

According to the differential curves illustrated in FIG. 10, the derivatives of normalized intensities of the tungsten oxide layers 80 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is seen in the increase rates thereof. In addition, the shapes of the differential curves corresponding to sample devices B and C within areas (v) and (vi) turn out to exhibit similarity with the respective UPS spectra illustrated in FIG. 9, from which the differential curves of FIG. 10 have been derived. Therefore, it can be said that the shapes of the UPS spectrum and the differential curve derived therefrom of each of sample devices B and C within areas (v) and (vi) resemble the shape of an exponential function curve.

Contrariwise, the differential curve corresponding to the tungsten oxide layer 80 of the sample device A in FIG. 10 exhibits a rapid rise from the vicinity of point (iv) towards the direction of point (iii). Thus, the shape of the differential curve corresponding to the tungsten oxide layer 80 of the sample device A within the areas (v) and (vi) clearly differs from the shape of an exponential function curve. Similarly, in FIG. 9, the spectrum corresponding to the tungsten oxide layer 80 of the sample device A, from which the differential curve in FIG. 10 corresponding to sample device A is derived, begins to protrude in the vicinity of point (iv). At the same time, it could also be seen that the spectrum in FIG. 9 exhibits a spectral protrusion near the Fermi surface, which is not found in a spectrum having the shape of an exponential function curve. In other words, such a sample device A is characterized in that an occupied energy level near the Fermi surface is found in an area which is approximately 1.8 eV to 3.6 eV lower than the lowest energy level of a valence band of the hole injection layer, in terms of binding energy. More specifically, a spectral protrusion near the Fermi surface corresponding to the occupied energy level near the Fermi surface can be clearly seen in an area between a point which is approximately 2.0 eV lower than the lowest energy level of the valence band and another point which is approximately 3.2 eV lower than the lowest energy level of the valence band, in terms of binding energy, in the UPS spectrum corresponding to the sample device A.

Figure 11:
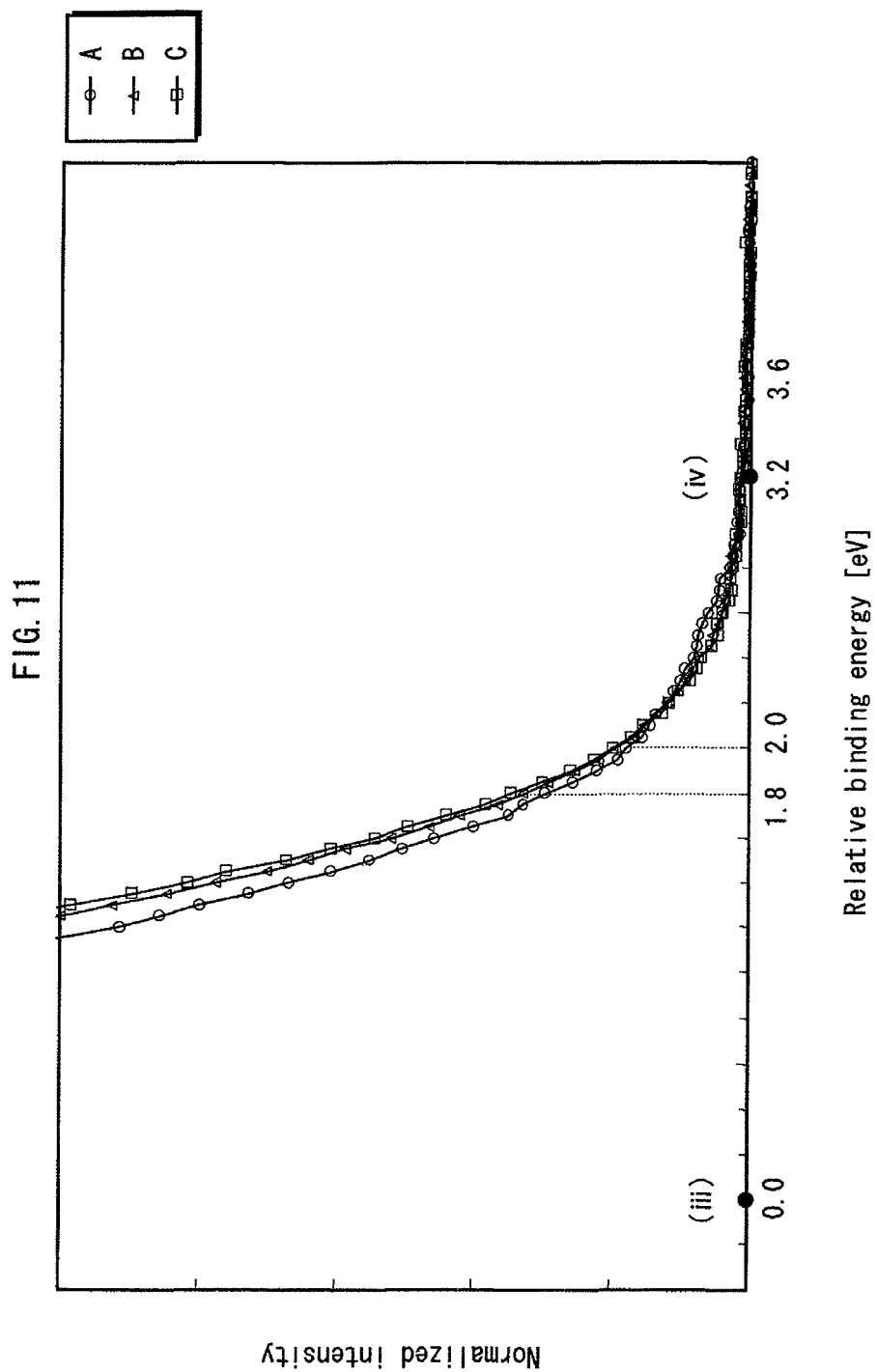
FIG. 11 illustrates UPS spectra of tungsten oxide that have been subjected to atmospheric exposure.

Next, the inventors conducted atmospheric exposure of the tungsten oxide layer 80 of each of the sample devices A, B, and C for a period of one hour at normal temperature. Note that the sample devices A, B, and C are the same sample devices as used in conducting the UPS measurement to obtain the UPS spectra in FIG. 9, and therefore have not been exposed to the atmosphere since the forming of the tungsten oxide layer 80. Following atmospheric exposure, the inventors conducted UPS measurement once again with respect to the tungsten oxide layer 80 of each of the sample devices A, B, and C. Observation was conducted focusing on the changes in the UPS spectrum corresponding to each of the sample devices A, B, and C. FIG. 11 illustrates UPS spectra which correspond to the sample devices A, B, and C within the area (y) in FIG. 8. The horizontal axis in FIG. 11 is similar to the horizontal axis in FIG. 9, and points (iii) and (iv) in FIG. 11 are provided at the same points on the horizontal axis as the respective points (iii) and (iv) in FIG. 9.

According to the UPS spectra illustrated in FIG. 11, the tungsten oxide layer 80 of each of the sample devices B and C do not exhibit the spectral protrusion near the Fermi surface. Thus, it has been seen that the UPS spectra corresponding to the sample devices B and C do not exhibit the spectral protrusion either before or after atmospheric exposure. Contrariwise, it can be seen that the tungsten oxide layer 80 of the sample device A still exhibits the spectral protrusion near the Fermi surface, although the spectrum differs in intensity and shape when compared to before atmospheric exposure. Hence, it is observed that the tungsten oxide layer 80 of the sample device A maintains the same characteristics as before atmospheric exposure, even after conducting exposure thereof to the atmosphere for a certain period of time. Therefore, it can be concluded that the tungsten oxide layer 80 of the sample device A has a certain level of stability with respect to ambient atmosphere.

In the above, description has been provided regarding the sample devices A, B, and C with focus on the respective UPS spectra obtained as a result of UPS measurement. However, it should be noted that the existence of the spectral protrusion near the Fermi surface is to be similarly observed when applying an XPS measurement or a hard X-ray photoemission spectroscopy measurement.

Figure 12:
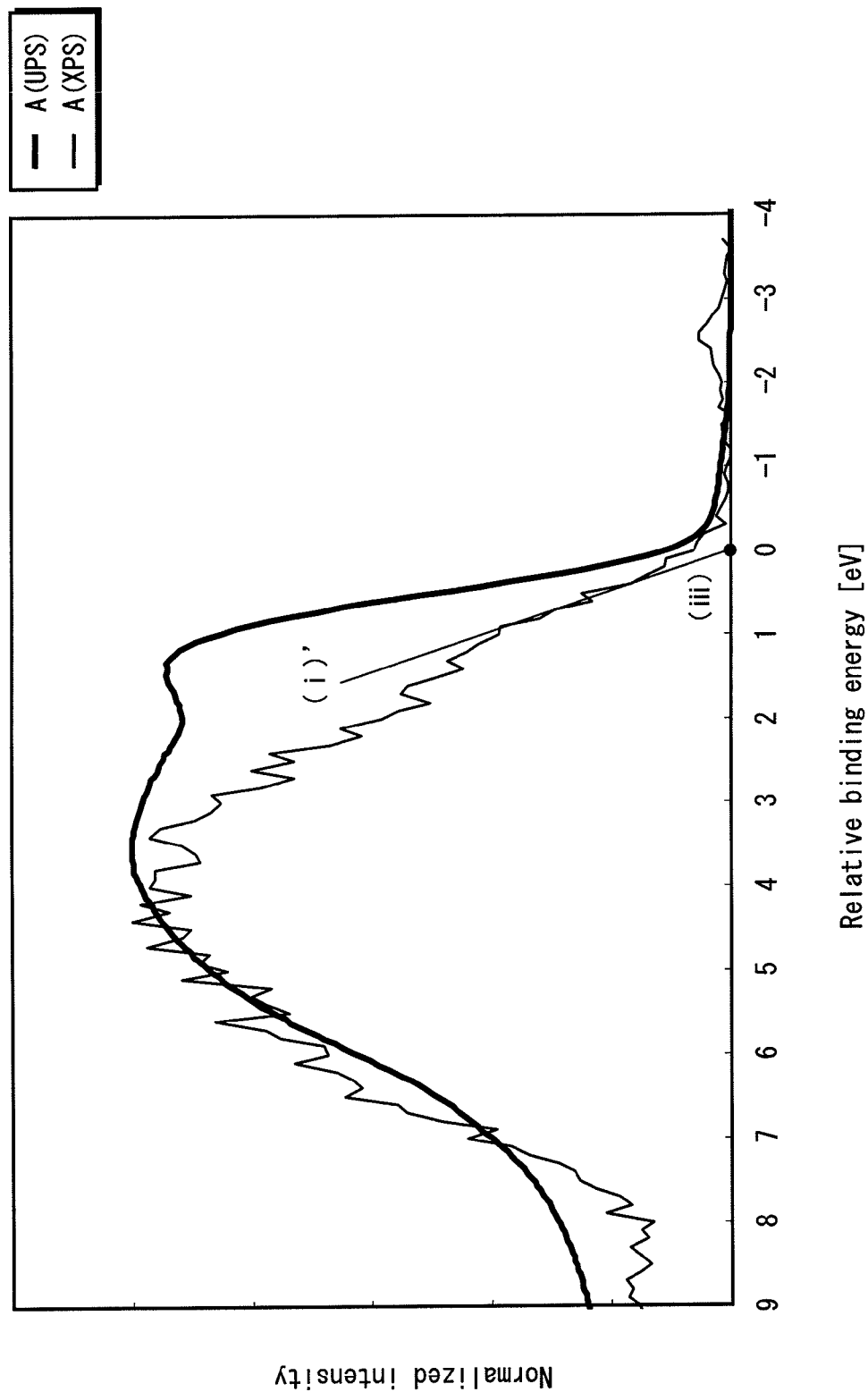
FIG. 12 illustrates both a UPS spectrum and an XPS spectrum of tungsten oxide pertaining to the present disclosure.

FIG. 12 illustrates an XPS spectrum of the tungsten oxide layer 80 of the sample device A after atmospheric exposure thereof. Note that, in FIG. 12, the XPS spectrum is overlaid with a UPS spectrum of the tungsten oxide layer 80 of the sample device A (the same UPS spectrum as illustrated in FIG. 8), so as to enable comparison between the two spectra.

The conditions under which the XPS measurement was conducted are similar to the conditions under which the UPS measurement was conducted as already described in the above, differing only in that an Al—K alpha line was used as the light source. In FIG. 12, point (iii) is provided at the same point on the horizontal axis as point (iii) in FIG. 8, and further, the horizontal axis indicates a relative binding energy with respect to point (iii). In addition, a line in the XPS spectrum corresponding to the line (i) in FIG. 8 is illustrated as line (i)' in FIG. 12.

As illustrated in FIG. 12, the spectral protrusion near the Fermi surface of the tungsten oxide layer 80 of the sample device A is found in the XPS spectrum, as well as in the UPS spectrum. In detail, in the XPS spectrum of the tungsten oxide layer 80 of the sample device A, the spectral protrusion near the Fermi surface is exhibited as a protrusion of a considerable degree within an area between a point which is approximately 1.8 eV lower than the lowest energy level of a valence band of the hole injection layer and another point which is 3.6 eV lower than the lowest energy level of the valence band of the hole injection layer, in terms of binding energy. Further, the spectral protrusion near the Fermi surface was similarly found when a hard X-ray photoemission spectroscopy measurement was conducted.

In the above, the sample device 1000A (illustrated in FIG. 7) was used, instead of the organic EL element 1000 which is illustrated in FIG. 1, as the sample device for conducting the photoelectron spectroscopy measurements. The sample device 1000A has a structure which differs from the organic EL element 1000, and is formed by disposing the tungsten oxide layer 80 on the conductive silicon substrate 70. Here, it should be noted that this measure has been taken merely for the sake of preventing the occurrence of charge-up, and thus, the structure of the organic EL element pertaining to the present disclosure is not to be limited thereby.

According to another experiment conducted by the present inventors, when UPS measurement and XPS measurement were conducted against a sample device having the structure of the organic EL element 1000 as illustrated in FIG. 1 (the structure where the anode 2 composed of ITO and the hole injection layer 4 composed of tungsten oxide are formed in the stated order on one surface of the substrate 1), the occurrence of charge-up was encountered during the measurements.

However, by using a neutralizing electron gun in such measurements, the occurrence of charge-up can be inhibited. When the neutralizing electron gun was used, there were cases where the absolute value of the binding energy indicated by each of the occupied energy levels of the hole injection layer 4 (for instance, the binding energy value when the Fermi surface of the photoelectron spectroscopy device itself is determined as the reference point) differed from the corresponding value of the tungsten oxide layer 80 of the sample device 1000A. However, a spectrum having a similar shape as the spectrum of the sample device 1000A was obtained, at least within an area extending from the band gap energy level to the lowest energy level of the valence band, in terms of binding energy.

(Analysis Concerning Hole Injection Efficiency)

The principle of the effect that the existence of the occupied energy level near the Fermi surface in the hole injection layer composed of tungsten oxide has on hole injection efficiency can be explained as provided in the following. Note that the existence of the occupied energy level near the Fermi surface is to be observed as a spectral protrusion near the Fermi surface in, for instance, a UPS spectrum of the hole injection layer.

It has been frequently reported, with reference to results of experiments and first principles calculations, that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms due to oxygen atom vacancy or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (see Non-Patent Literature 2). Here, explanation is provided concerning molybdenum oxide since molybdenum oxide has many common physical properties similar to those of tungsten oxide, such as a catalyst effect, electrochromism, and photochromism.

Further in detail, the present inventors have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 13:
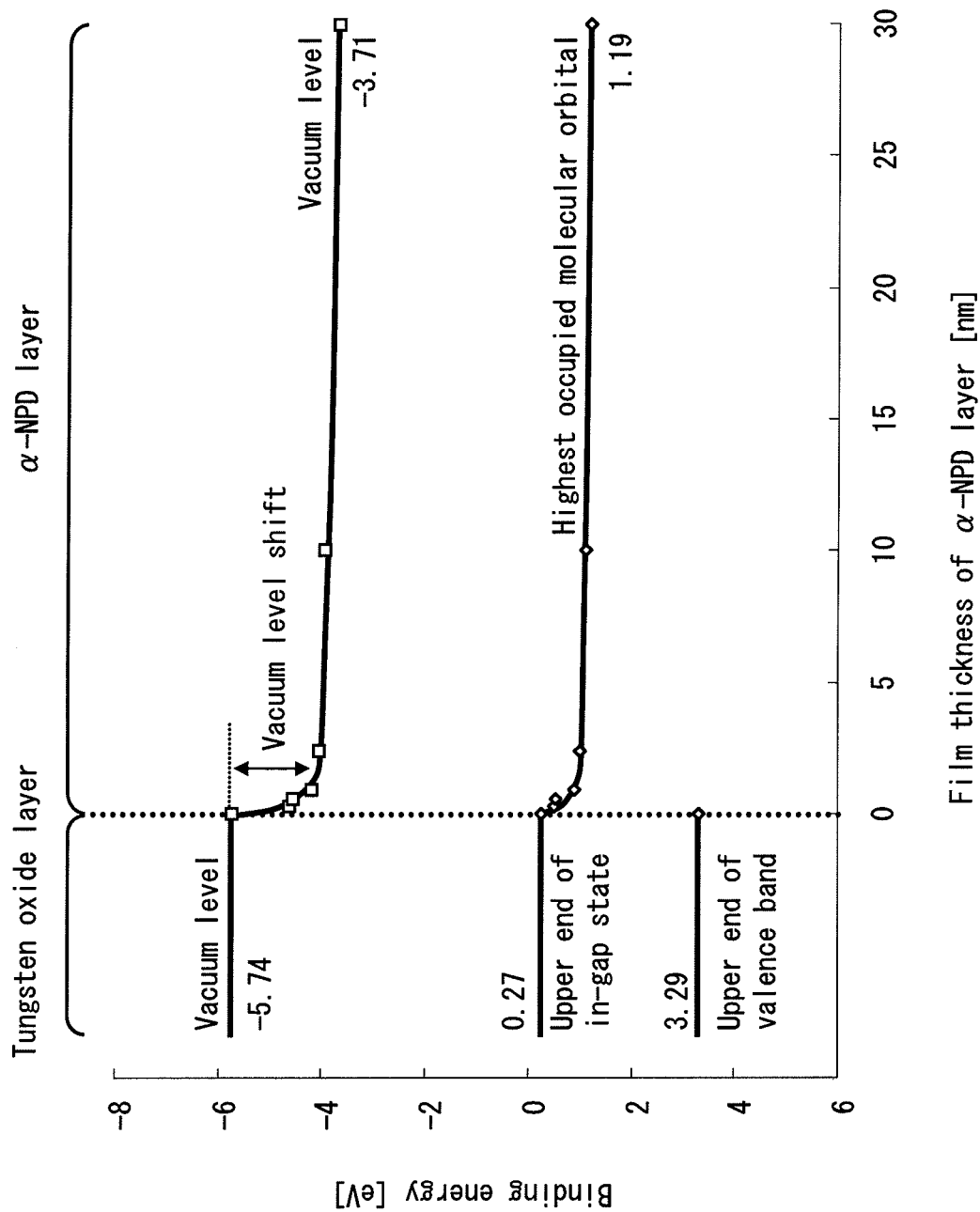
FIG. 13 is a diagram illustrating an energetic state at an interface between the tungsten oxide and α-NPD.

FIG. 13 is a diagram illustrating an energetic state at an interface between the tungsten oxide layer having the occupied energy level near the Fermi surface and an α-NPD layer.

FIG. 13 illustrates, with regards to the tungsten oxide layer (corresponding to the hole injection layer), the lowest binding energy of the valence band (illustrated as "upper end of the valence band" in FIG. 13) and the binding energy at the point at which the spectral rise near the Fermi surface begins (illustrated as "upper end of the in-gap state" in FIG. 13). Seen in relation to the UPS spectrum of the tungsten oxide layer, the upper end of the valence band in FIG. 13 corresponds to point (iii) in FIG. 8, and the upper end of the in-gap state in FIG. 13 corresponds to point (iv) in FIG. 9.

In addition, FIG. 13 illustrates a thickness of the α-NPD layer and a binding energy of the HOMO of the α-NPD, in a case where the α-NPD layer (corresponding to the functional layer) is disposed on the tungsten oxide layer. Furthermore, a vacuum level of each of tungsten oxide layer and the α-NPD layer is provided as well, in relation to the other energy levels illustrated. Here, the binding energy of the HOMO of the α-NPD layer corresponds to the binding energy at a point at which a peak of binding energy corresponding to the HOMO begins in the UPS spectrum of the α-NPD layer.

More specifically, the energy diagram illustrated in FIG. 13 is obtained through repeated alternate execution of the UPS measurement and the ultra high vacuum vapor deposition, where the tungsten oxide layer formed on the ITO substrate is transferred back and forth between a photoelectron spectroscopy device and a ultra high vacuum vapor deposition device connected to the photoelectron spectroscopy device. Since the occurrence of charge-up was not encountered during the UPS measurement, the binding energy on the vertical axis in FIG. 13 is indicated as an absolute value taken with respect to a reference point, which is the Fermi surface of the ITO substrate.

It could be seen in FIG. 13 that, at least within a 0-0.3 nm distance from the surface of the α-NPD layer facing the tungsten oxide layer, or that is, in a vicinity of the interface between the tungsten oxide layer and the α-NPD layer, the upper end of the in-gap state of the tungsten oxide layer and the HOMO of the α-NPD layer are substantially equivalent in terms of binding energy. Thus, a state can be seen where, so to speak, the energy levels of the tungsten oxide layer and the α-NPD layer are in alignment with each other (hereinafter, this state is referred to as an "interface energy level alignment"). Here, it should be noted that the state of "substantially equivalent" as referred to in the above actually includes a state where a slight difference exists between the binding energies of the two layers, and denotes a range of ±0.3 eV inclusive, to be specific.

Further, it can be seen from FIG. 13 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large at around 2 eV, it could be reasonably assumed that the EDL has been formed as a result of some type of effect that is similar to a chemical bond. Thus, it can be reasonably assumed that the interface energy level alignment has been formed as a result of interaction between the tungsten oxide and the α-NPD.

Further, the present inventors assume that the interaction, in specific, is caused by a mechanism as described in the following.

First of all, the occupied energy level near the Fermi surface derives from the 5d orbital of a tungsten atom, as description has already been made in the above. In the following, the 5d orbital of the tungsten atom is referred to as a "W5d orbital corresponding to the spectral protrusion".

When the HOMO of an α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface between the tungsten oxide layer and the α-NPD layer, which brings about a vacuum level shift and an interface energy level alignment.

More specifically, many reports have been made, as a result of first principles calculations, that the HOMO of an α-NPD molecule is characterized in that: (i) the probability density thereof exhibits an uneven distribution of the HOMO near a nitrogen atom in an amine structure of the α-NPD molecule; and thus, (ii) the structure thereof includes, as the main composing element, a lone pair of electrons of a nitrogen atom. According to this, it could be assumed that, at the interface between the tungsten oxide layer and the layer of an amine-containing organic molecule, an electron transfers from the lone pair of electrons of the nitrogen atom in the amine structure of the amine-containing organic molecule, to the W5d orbital corresponding to the spectral protrusion.

The fact that there are reports made of interface energy level alignments, similar to the interface energy level alignment between the tungsten oxide layer and the α-NPD layer illustrated in FIG. 13, at interfaces formed between a vapor deposition film of molybdenum oxide and each of α-NPD and F8BT supports this assumption (see Non-Patent Literatures 3, 4, and 5). Note that molybdenum oxide has a physical property similar to tungsten oxide, as description has already been made in the above, and further, α-NPD and F8BT are commonly amine-containing organic molecules.

The excellent hole injection efficiency of the hole injection layer of the organic EL element pertaining to the present disclosure can be explained according to the interface energy level alignment as described in the above. That is, an interface energy level alignment occurs between the hole injection layer composed of tungsten oxide that has the occupied energy level near the Fermi surface and the adjacent functional layer. As a result, the binding energy at the point at which the spectral protrusion corresponding to the occupied energy level near the Fermi surface begins and the binding energy of the HOMO of the functional layer become substantially equivalent. The injection of holes takes place between such energy levels having the interface energy level alignment formed therebetween. Therefore, the hole injection barrier to be overcome when injecting holes to the HOMO of the functional layer is minimized to such an extent as could be ignored.

However, as description has been already provided in the above, the occupied energy level near the Fermi surface is formed by factors such as oxygen vacancy and structures similar thereto, and further, it is quite unlikely, in reality, that tungsten oxide exists that is completely free of all such factors. Hence, for instance, it can be reasonably assumed that, even in such tungsten oxide as used to prepare the above-mentioned sample devices B and C, which does not exhibit the spectral protrusion near the Fermi surface in the photoelectron spectroscopy spectrum, oxygen vacancy and structures similar thereto exist, however minimal they may be in terms of number.

In view of this, hereinafter, explanation is provided, with reference to FIG. 14, of the reason for which the hole-only element HOD-A and the organic EL element BPD-A, both having the hole injection layer 4 which corresponds to the tungsten oxide layer 80 of the sample device A, exhibit excellent hole injection efficiency as observed through the above experiments.

To bring about the interaction between the HOMO of the organic molecule composing the functional layer and the occupied energy level near the Fermi surface of the tungsten oxide layer when disposing the functional layer on the tungsten oxide layer, the following condition needs to be fulfilled. That is, a portion of the organic molecule where the probability density of the HOMO is high, and an oxygen vacancy or a structure similar thereto of the tungsten oxide layer (illustrated as "injection site (x)" in FIG. 14) must approach each other to a distance at which the interaction is triggered (fall into contact with each other). The portion of the organic molecule where the probability density of the HOMO is high (illustrated as "injection site (y)" in FIG. 14) is, for instance, a nitrogen atom in the amine structure of an amine-containing organic molecule.

Figure 14A:
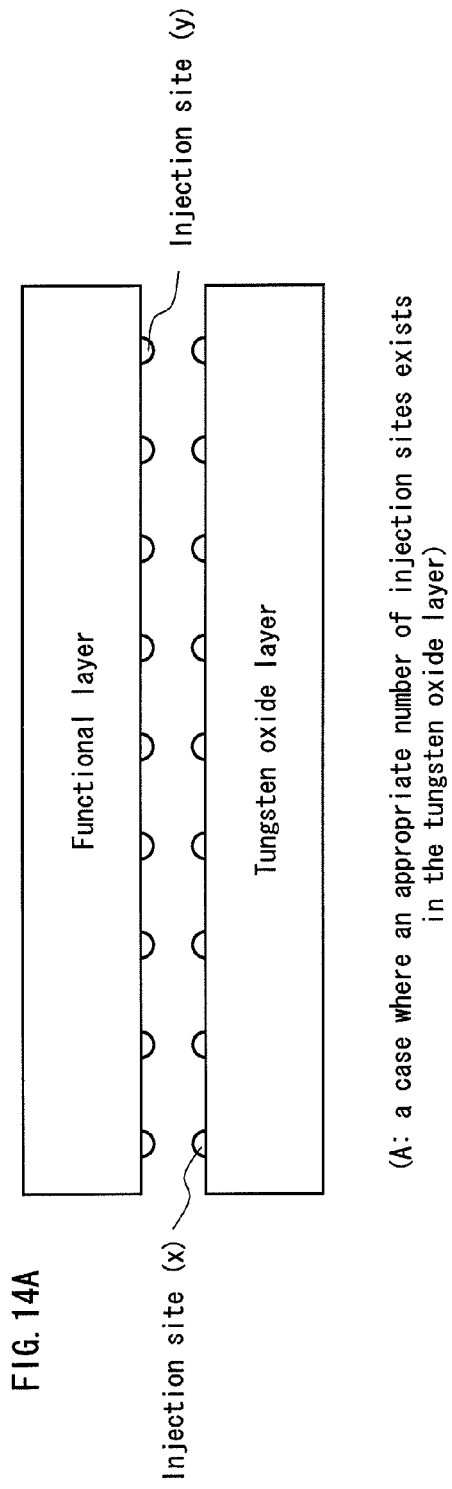
FIGS. 14A and 14B are diagrams for explanation of effects yielded by injection sites of the hole injection layer and a functional layer.
Figure 14B:
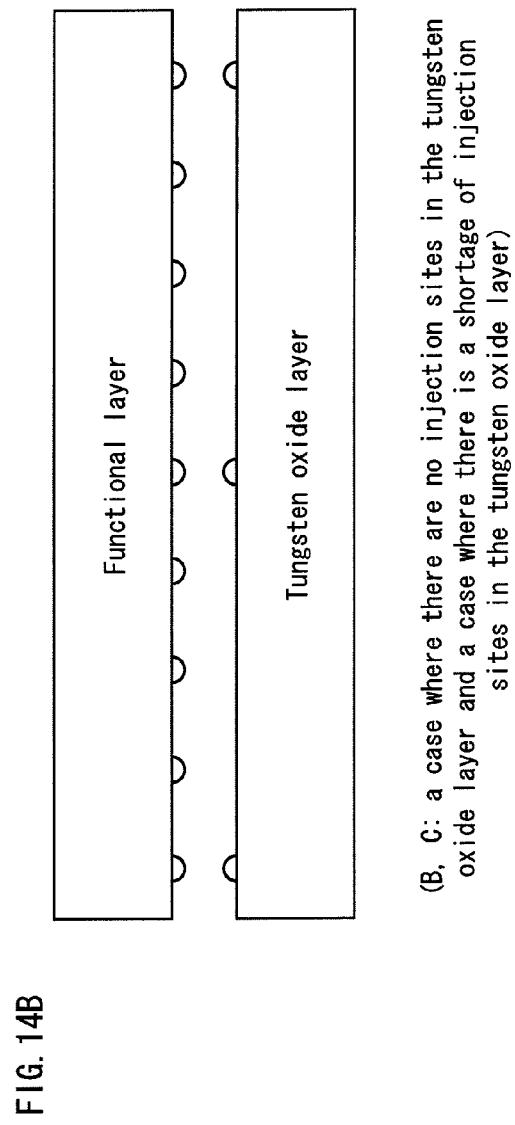

However, in a tungsten oxide layer as incorporated in the sample devices B and C, the number density of the injection site (x), if any, is extremely small, as illustrated in FIG. 14B. Accordingly, the upward protrusion near the Fermi surface does not appear in the UPS spectra thereof. Thus, the possibility of the injection site (x) and the injection site (y) falling into contact is extremely low. Since the injection of holes takes place where the injection site (x) and the injection site (y) fall into contact, it is clear that hole injection efficiency in sample devices B and C is extremely low.

In contrast to this, an abundance of injection sites (x) exists in the tungsten oxide layer which exhibits the spectral protrusion near the Fermi surface, as illustrated in FIG. 14A. Note that the tungsten oxide layer exhibiting the spectral protrusion near the Fermi surface is, for instance, the tungsten oxide layer incorporated in the above-mentioned sample device A. Thus, there is a high possibility of the injection sites (x) and the injection sites (y) falling into contact, and therefore the tungsten oxide layer exhibits excellent hole injection efficiency.

When summarizing the description provided in the above, the excellent hole injection efficiency of the organic EL element pertaining to the present disclosure can be explained as follows.

Firstly, a hole injection layer composed of tungsten oxide exhibits, in the photoelectron spectroscopy spectrum thereof, an upward protrusion near the Fermi surface. Such a spectral protrusion near the Fermi surface is indicative of a considerable number of oxygen vacancies and structures similar thereto existing at the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the highest occupied molecular orbital (HOMO) of the organic molecule.

As such, if a considerable number of oxygen vacancies and structures similar thereto is found at the surface region of the hole injection layer, the possibility increases of the occupied energy level near the Fermi surface and a portion of the organic molecule having a high probability density of the HOMO falling into contact with each other. Thus, the interface energy level alignment occurs efficiently, and accordingly, the tungsten oxide layer exhibits excellent hole injection efficiency.

(Thinning of the Hole Injection Layer)

In order to examine the characteristics of the organic EL element having undergone the bank forming process, the present inventors prepared the organic EL element 1000 including the bank 5 (see FIG. 1), separately from the aforementioned assessment devices not including the bank 5, and conducted experiments using the organic EL element 1000. As a result, the present inventors has confirmed that the organic EL element 1000 can be driven at low voltage and has high luminous efficiency, similarly to the aforementioned assessment devices.

In the above experiments regarding the organic EL element, the present inventors found that the thickness of the hole injection layer was reduced as compared to the thickness thereof immediately after the hole injection layer was formed (hereinafter, "film thinning" or simply "thinning"). The present inventors assumed that the thinning of the hole injection layer occurred in the bank forming process. In order to find a cause of the thinning phenomenon of the hole injection layer, the following experiments were further conducted.

Specifically, a layer composed of tungsten oxide, which was to become a hole injection layer, was formed on a glass substrate by a sputtering method (the film forming conditions being the same as those for the hole-only devices). Thereafter, a resin material layer composed of a predetermined resin material (a material of "TFR" series manufactured by Tokyo Ohka Kogyo Co., Ltd.) was disposed on the hole injection layer based on a spin coating method (at room temperature; 2500 rpm/25 sec) and baked (100° C.; 90 sec). Next, a developing process (using TMAH 2.38% solution; developing time being 60 sec) and a washing process (using pure water, washing time being 60 sec) were performed. Subsequently, the resin material layer was removed. The disposition of the resin material layer, the developing process, and the washing process as described above were performed by simulating the actual bank forming process.

Figure 15:
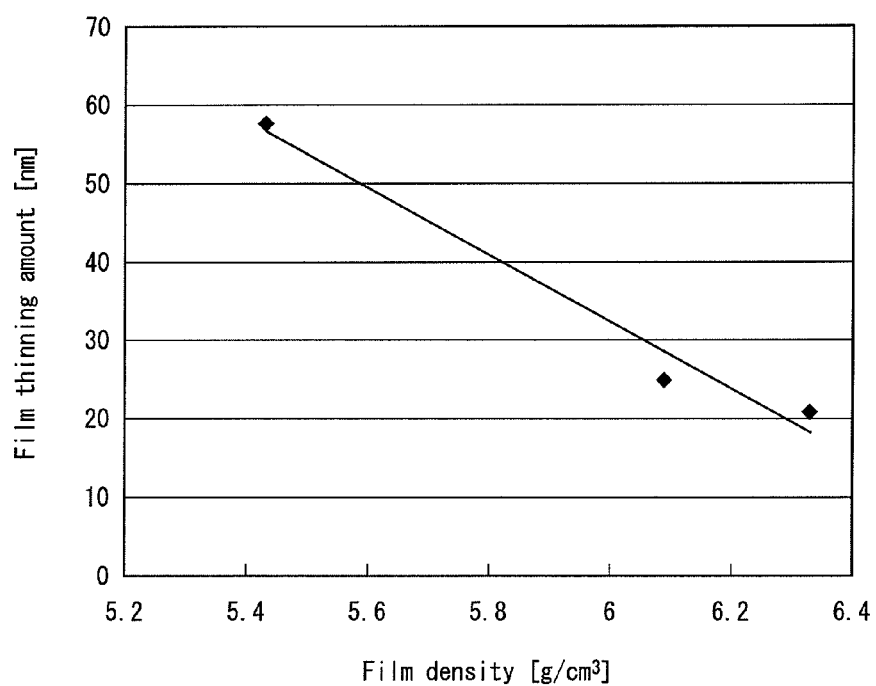
FIG. 15 is a graph illustrating a relation between film thinning amount and film density of the hole injection layer.

Table 5 illustrates the conditions for the experiments and the results thereof. FIG. 15 is a graph illustrating a relation between film density and film thinning amount in Table 5.

TABLE 5

|  | Sample Device | | |
| --- | --- | --- | --- |
|  | Sample Device A | Sample Device B | Sample Device C |
| Total Pressure (Pa) | 4.8 | 2.7 | 2.7 |
| Ar:O$_2$ | 100:100 | 43:100 | 43:100 |
| Input Power (W) | 250 | 500 | 1000 |
| Film density (g/cm$^3$) | 5.43 | 6.09 | 6.33 |
| Film thinning amount (nm) | 57.7 | 25 | 20.9 |
| Remarks/Film-forming device | SMD | SOLCIET | SOLCIET |

As shown in the experiment results in Table 5, the tungsten oxide layer, which was to become a hole injection layer, had a thickness of 80 nm immediately after the film forming process. However, the thickness of the tungsten oxide layer ultimately became approximately 23 nm. This confirmed that the thickness of the tungsten oxide layer was reduced by approximately 57 nm by film thinning (see the sample device A having the best characteristics among the sample devices A, B, and C).

Also, as illustrated in FIG. 15, there is a strong causal relation between the thinning amount of the tungsten oxide layer and the density of the tungsten oxide layer. Specifically, the lower the density of the tungsten oxide layer, the larger the thinning amount of the tungsten oxide layer.

The cause of the above relation is not perfectly clear at present. However, it can be seen, from Tables 4 and 5, and the graph in FIG. 15, that the better the film characteristics (e.g., light-emitting characteristics), the lower the density of the tungsten oxide layer. Note that the present inventors conducted another examination. From this examination, it was found that when the tungsten oxide layer has a structure deriving from oxygen vacancy, the density of the tungsten oxide layer is reduced. As a result, the tungsten oxide layer can achieve excellent hole injection characteristics. Accordingly, it can be assumed that the organic EL element including the tungsten oxide layer can be driven at low voltage.

Also, the present inventors examined the cause of thinning of the tungsten oxide layer, and found that the tungsten oxide layer dissolves to solvents used during the developing process and/or the washing process, and this causes film thinning. As described above, the density of the tungsten oxide layer is reduced by the structure deriving from oxygen vacancy. This is assumingly because a large number of micro-crystal structures are formed inside the tungsten oxide layer. Specifically, when a large number of micro-crystal structures are formed inside the tungsten oxide layer, solvents (i.e., developing solution, cleaning liquid, etc.) used during the film forming process pertaining to the formation of the bank are more likely to infiltrate into the tungsten oxide layer, resulting in the occurrence of film thinning.

In general, film thinning as described above complicates the management of the thickness of the tungsten oxide layer. Also, there is a concern that such film thinning may affect the hole injection characteristics in some way after the completion of the organic EL element. For this reason, if a person skilled in the art finds out the occurrence of the thinning of a hole injection layer, the person may hesitate to form the hole injection layer by using tungsten oxide.

However, the present inventors conducted extensive research on this point, and found that adjustment in the thinning amount of the tungsten oxide layer is possible, for example, by appropriately changing developing conditions (i.e., reducing the concentration of the developing solution from 2.38% to approximately 0.2%) or by appropriately changing baking conditions. Such adjustment can control the thickness of the tungsten oxide layer in view of film thinning. Based on the technology pertaining to the adjustment in the thinning amount of a hole injection layer, the present inventors further conducted examination on realistic light emitters and made prototypes thereof. As a result, the following technical matters were confirmed.

Steps of making the prototypes of light emitters are as follows. First, a hole injection layer including tungsten oxide was formed on an anode. Next, a bank material layer was disposed on the hole injection layer. Then, the bank material layer was patterned into a predetermined shape having an aperture. The aperture is created for the purpose of forming a functional layer therein. At this point, processes of exposure, developing, and washing were performed. Subsequently, the functional layer was formed on an area of the hole injection layer corresponding to the aperture. Then, a cathode was formed on the functional layer.

The present inventors examined the structure of an organic EL element obtained through the above process, and confirmed that the organic EL element has the following structure. That is, in the area of the hole injection layer corresponding to the aperture, a concavity is formed as a result of the tungsten oxide being dissolved. Due to this concavity, the hole injection layer has a recessed structure as a whole.

The present inventors focused on a boundary portion between an inner bottom surface and an inner side surface of the recess of the hole injection layer, and found that by applying an ink material constituting a functional layer to the inner surface of the recess including the boundary portion, a favorable functional layer having an improved wettability can be formed.

Accordingly, the present inventors conceived the following structure. That is, in a region defined by the bank, a surface of the hole injection layer at the side of the functional layer is formed to have a recess, and the inner surface of the recess is in contact with the functional layer. This structure is described in detail in Embodiment 2 below.

In Embodiment 2, description is provided by focusing on differences from Embodiment 1.

Embodiment 2

Schematic Structure of the Light Emitter

Figure 16:
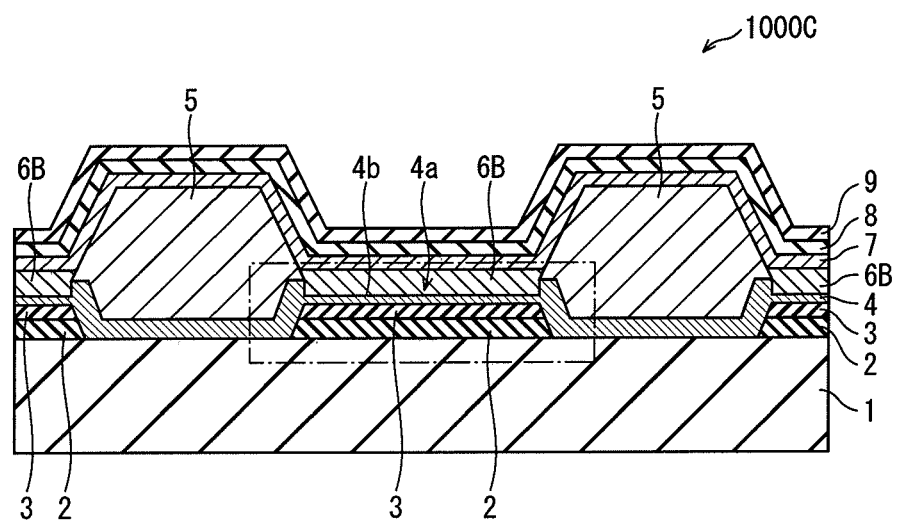
FIG. 16 is a schematic view showing a layered condition of layers constituting a light emitter pertaining to Embodiment 2.
Figure 17:
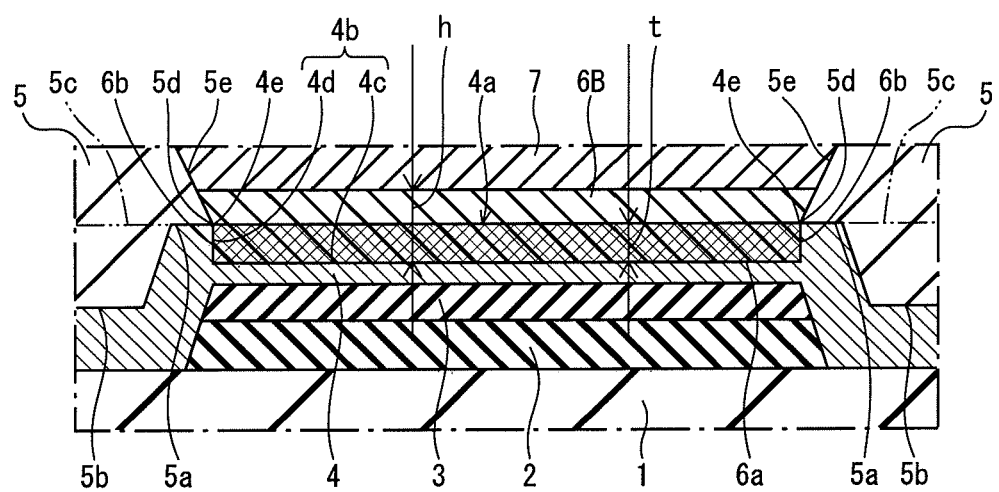
FIG. 17 is an enlarged view of a part enclosed with a dashed line in FIG. 16.

FIG. 16 is a schematic view illustrating a layered condition of the layers constituting a light emitter 1000C pertaining to Embodiment 2. FIG. 17 is an enlarged view of a part enclosed with a dashed line in FIG. 16.

As shown in FIG. 16, the light emitter 1000C pertaining to Embodiment 2 is a top emission type organic EL element including RGB pixels that are arranged in a matrix or in line. Each pixel includes layers which are disposed on the substrate 1.

The light emitter 1000C is different from the organic EL element 1000 in Embodiment 1, in that an ITO layer 3 is disposed on the anode 2 and that the hole injection layer 4 is disposed on the ITO layer 3. Also, in the light emitter 1000C, the buffer layer 6A is omitted. Also, an electron injection layer 7 is disposed on the light-emitting layer 6B, and a passivation layer 9 disposed on the cathode 8.

On the substrate 1, the anode 2 is formed together with other anodes 2 in a matrix or in line. On the anode 2, the indium tin oxide (ITO) layer 3 and the hole injection layer 4 as a charge injection transport layer are layered in this order.

The ITO layer 3 is disposed only on the anode 2, whereas the hole injection layer 4 is formed not only on the anode 2 but also over the substrate 1.

On the hole injection layer 4, the bank 5 that defines a region of the pixels is formed, and in the region defined by the bank 5, the light-emitting layer 6B is disposed. On the light-emitting layer 6B, the electron injection layer 7, the cathode 8, and the passivation layer 9 are formed continuously across the consecutive pixels, passing over the bank 5.

The region defined by the bank 5 has a multi-layer structure in which the ITO layer 3, the hole-injection layer 4, the light-emitting layer 6B and the electron injection layer 7 are layered in this order. Such a layer structure constitutes a functional layer. Note that the functional layer may include other layers such as the hole transport layer and the electron transport layer.

(Components of the Light Emitter)

The anode 2 in the present embodiment has a single layer structure and is formed with Ag (silver). The anode 2 may be formed with APC (alloy of silver, palladium, and copper), ARA (alloy of silver, rubidium, and gold), MoCr (alloy of molybdenum and chromium), NiCr (alloy of nickel and chromium), etc. In the case of a top emission type light-emitter, it may be preferable, for example, that the anode 2 is formed with a light-reflective material.

The ITO layer 3 is disposed between the anode 2 and the hole injection layer 4 and has a function of guaranteeing excellent bondability between the anode 2 and the hole injection layer 4.

The hole injection layer 4 has the same structure as in Embodiment 1, and is composed of a tungsten oxide (WOx) layer formed under film forming conditions that achieves excellent hole injection characteristics.

(Hole Injection Layer)

As shown in FIG. 17, the hole injection layer 4 extends along the bottom surface of the bank 5 to an adjacent pixel. Also, a portion of the hole injection layer 4 in the region defined by the bank 5 has a recessed structure. In the recessed structure, the portion of the hole injection transport layer 4 is lower than the bottom surface of the bank 5 to have a recessed portion 4a (indicated with mesh hatching in FIG. 17). This recessed portion 4a is formed as a result of dissolution of the hole injection layer 4 by a predetermined solvent. In addition, with regard to the hole injection layer 4, only a film thickness in the region defined by the bank 5 is smaller than a film thickness in other regions, and the film thickness in the other regions is entirely and substantially uniform. Since the hole injection layer 4 is formed with a metal compound having liquid-philicity, an inner surface 4b of the recessed portion 4a has excellent wettability to ink. Accordingly, this allows for drops of the ink ejected into the region defined by the bank 5 to easily adhere to the inner surface 4b of the recessed portion 4a, and the drops of the ink easily stay within the region defined by the bank 5.

Note that the hole injection layer 4 only has to have a recessed structure according to which the recessed portion 4a is lower than an edge portion 5a of the bottom surface of the bank 5, and does not have to be lower than the entire bottom surface of the bank 5. In the recessed structure of the present embodiment, the recessed portion 4a is lower than the edge portion 5a of the bottom surface of the bank 5 but not lower than a central part 5b of the bottom surface of the bank 5. Alternatively, for example, by setting the central part 5b as high as the edge portion 5a and planarizing the bottom surface of the bank 5, as shown by an alternate long and two short dashes line 5c in FIG. 17, it is possible to have the recessed structure according to which the recessed portion 4a is lower than the entire bottom surface of the bank 5.

The hole injection layer 4 has a recessed structure according to which a portion of the hole injection layer 4 is lower than the lower edge 5d of the bank 5. To be specific, an upper surface of the hole injection layer 4, which is defined by the bank 5, is sunken from a level of the lower edge 5d in a direction substantially vertical to the upper surface of the substrate 1. Like this, in the case of the recessed structure according to which the portion of the hole injection layer 4 is lower than the lower edge 5d of the bank 5, a film thickness of the light-emitting layer 6B can be uniform over a wide range, and as a result, irregular luminance is not likely to occur in the light-emitting layer 6B.

The recessed structure of the hole injection layer 4 has a cup-like shape. To be more specific, the inner surface 4b of the recessed portion 4a is composed of an inner bottom surface 4c and an inner side surface 4d. The inner bottom surface 4c is substantially parallel with the upper surface of the substrate 1 and is flat. Also, the inner bottom surface 4c is in contact with a bottom surface 6a of the light-emitting layer 6B. The inner side surface 4d extends from an edge of the inner bottom surface 4c in a direction perpendicular to the upper surface of the substrate 1 and is in contact with a side surface 6b of the light-emitting layer 6B. When the recessed structure has a cup-like shape, the inner side surface 4d prevents the drops of the ink within the recessed portion 4a from moving in a direction parallel to the upper surface of the substrate 1. Accordingly, it is possible to more stably hold the drops of the ink within the region defined by the bank 5. Accordingly, it is possible to more stably hold the drops of the ink within the region defined by the bank 5. Moreover, when the recessed structure has the cup-like shape, the inner surface 4b of the recessed portion 4a becomes larger in area, and a contact surface of the drops of the ink and the hole injection layer 4 becomes larger in area. Accordingly, it is possible to more stably hold the drops of the ink within the region defined by the bank 5. Therefore, high-definition patterning of the light-emitting layer 6B is possible.

As described above, in the present embodiment, the bank 5 and the hole injection layer 4 are connected to each other in a substantially vertical direction, whereby the inner bottom surface 4c of the hole injection layer 4 is easily wettable by ink. This makes it possible to form the light-emitting layer 6B with excellent efficiency. Here, when the hole injection layer 4 does not have the recessed portion 4a, the boundary portion between the bank 5 and the hole injection layer 4 is not easily wettable by ink. Accordingly, the light-emitting layer 6B might not be fully formed at the bottom surface thereof, and as a result, electrical leakage might occur. That is, a technical meaning resides in that the hole injection layer 4 has the recessed portion 4a, and that the bank 5 and the hole injection layer 4 are connected to each other in the substantially vertical direction in order to excellently form the light-emitting layer 6B.

Note that, in the case that the bank 5 and the hole injection layer 4 are connected to each other in the substantially vertical direction, the interface between the bank 5 and the hole injection layer 4 does not always need to be horizontal but may be oblique.

Figure 18A:
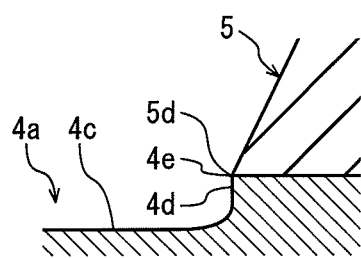
FIGS. 18A-18D are schematic views for explaining the shape of a recessed portion.
Figure 18B:
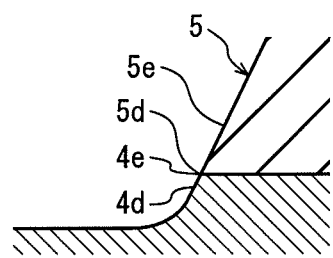
Figure 18C:
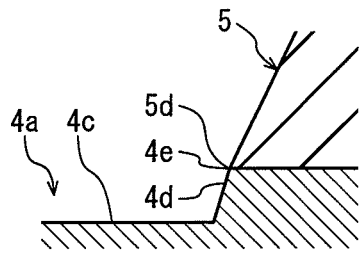
Figure 18D:
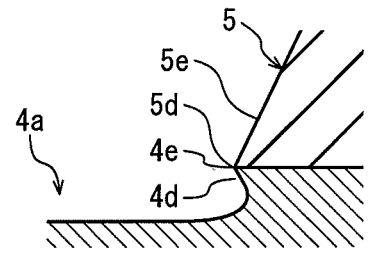

The following explains the recessed structure of the hole injection layer 4 in more detail. As shown in FIG. 18A, the inner side surface 4d of the recessed portion 4a is composed of a lower edge that is continuous with the inner bottom surface 4c and an upper edge 4e that is continuous with the lower edge. The upper edge 4e of the inner side surface 4d of the recessed portion 4a is aligned with the lower edge 5d of the bank 5 that is in contact with the light-emitting layer 6B. The part where the inner side surface 4d and the inner bottom surface 4c are continuous is rounded. Note that, when the upper edge 4e of the inner side surface 4d is aligned with the lower edge 5d of the bank 5, the recessed portion 4a is not limited to the shape shown in FIG. 18A, in which the inner side surface 4d is substantially vertical to the inner bottom surface 4c. As shown in FIG. 18B, the inner side surface 4d and a side surface 5e of the bank 5 may have substantially the same inclination and extend on the same plane. As shown in FIG. 18C, the part where the inner side surface 4d and the inner bottom surface 4c are continuous may not be rounded. As shown in FIG. 18D, the inner side surface 4d may be inclined opposite to the side surface 5e of the bank 5 so as to go under the bank 5.

Figure 19:
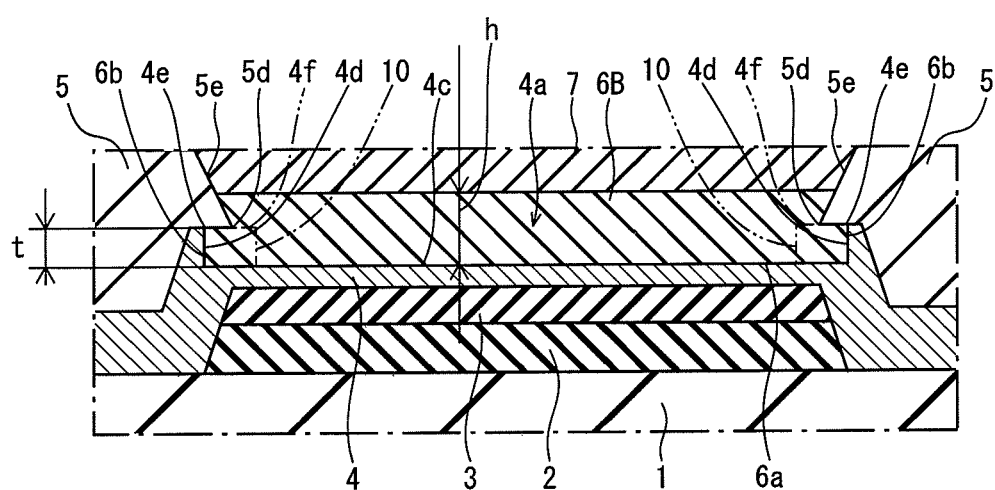
FIG. 19 is an enlarged view of a part enclosed with a dashed line in FIG. 16, with respect to a light emitter pertaining to a modification.
Figure 20A:
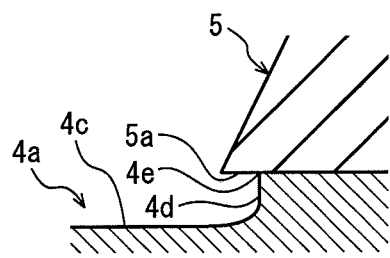
FIGS. 20A-20D are schematic views for explaining the shape of a recessed portion.
Figure 20B:
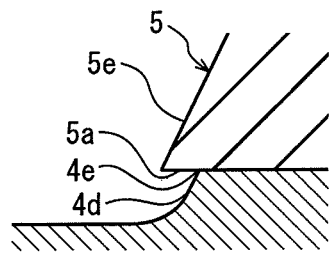
Figure 20C:
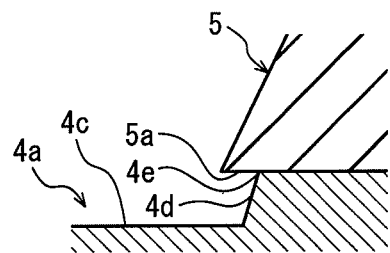
Figure 20D:
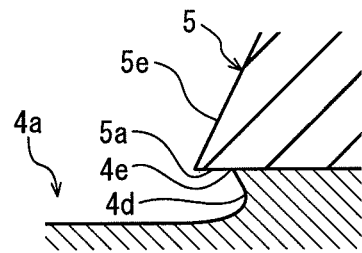

Alternatively, the hole injection layer 4 is not limited to having the recessed structure according to which a portion of the hole injection layer 4 is lower than the lower edge 5d of the bank 5. For example, as shown in FIG. 19, the upper edge 4e of the inner side surface 4d may not be aligned with the lower edge 5d of the bank 5, and the upper edge 4e may be closer to an adjacent pixel than the lower edge 5d of the bank 5 is. In such a case, as shown in FIG. 20A, the inner side surface 4d of the recessed portion 4a has the upper edge 4e that is in contact with the edge portion 5a of the bank 5. Note that, when the upper edge 4e of the inner side surface 4d is in contact with the edge portion 5a of the bank 5, the recessed portion 4a is not limited to the shape shown in FIG. 20A, in which the inner side surface 4d is substantially vertical to the inner bottom surface 4c. As shown in FIG. 20B, the inner side surface 4d and the side surface 5e of the bank 5 may have a substantially same inclination. As shown in FIG. 20C, the part where the inner side surface 4d and the inner bottom surface 4c are continuous may not be rounded. As shown in FIG. 20D, the inner side surface 4d may be inclined opposite to the side surface 5e of the bank 5 so as to go under the bank 5.

Concerning the inner side surface 4d, the upper edge 4e either meets the lower edge 5d of the bank 5 or is in contact with the edge portion 5a of the bank 5. Accordingly, a short circuit is not likely to occur between the anode 2 and the cathode 8. Supposedly, as shown by an alternate long and two short dashes line 10 in FIG. 19, when the upper edge 4e of the inner side surface 4d is not aligned with the lower edge 5d of the bank 5 and the upper edge 4e is closer to the center of the pixel than the lower edge 5d is, a short circuit might occur between the anode 2 and the cathode 8 via an exposed area 4f that is a part of an upper surface of the hole injection layer 4 and is exposed from the bank 5. Especially, as described later, when an average thickness h of the light-emitting layer 6B is smaller than or equal to an average depth t of the recessed portion 4a, the exposed area 4f of the hole injection layer 4, which is a part of an upper surface of the hole injection layer 4 and is uncovered with the bank 5, might be in contact with the electron injection layer 7 or the cathode 8. Accordingly, a short circuit might occur between the anode 2 and the cathode 8.

Returning to FIG. 17, although the present disclosure does not specifically specify the average depth t of the recessed portion 4a, the average depth t may be 5 nm-100 nm, for example. If the average depth t of the recessed portion 4a is equal to or greater than 5 nm, it is possible to hold sufficient amount of the ink within the recessed portion 4a. Accordingly, it is possible to stably maintain the ink within the region defined by the bank 5. Furthermore, since the light-emitting layer 6B is formed up to the edge of the bank 5 without being rejected, the short circuit between the anode 2 and the cathode 8 can be prevented.

Note that, the average depth t of the recessed portion 4a can be obtained by measuring a surface profile of the hole-injection layer 4 with use of a stylus profiler meter or an AFM (Atomic Force Microscope), and calculating a difference between an average height of a portion that is a crest and an average height of a portion that is a trough based on the surface profile.

The film thickness of the light-emitting layer 6B is not specifically determined. However, if the average thickness h of the light-emitting layer 6B after dried is equal to or greater than 100 nm and the average depth t of the recessed portion 4a is equal to or smaller than 100 nm, for example, it is possible to uniform a film thickness of the light-emitting layer 6B at the region defined by the bank 5.

Figure 21A:
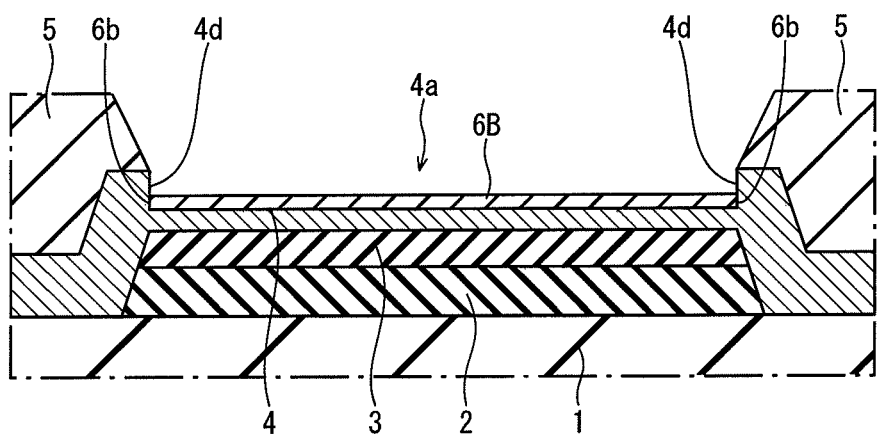
FIGS. 21A and 21B are schematic views for explaining an exemplary thickness of a light-emitting layer.
Figure 21B:
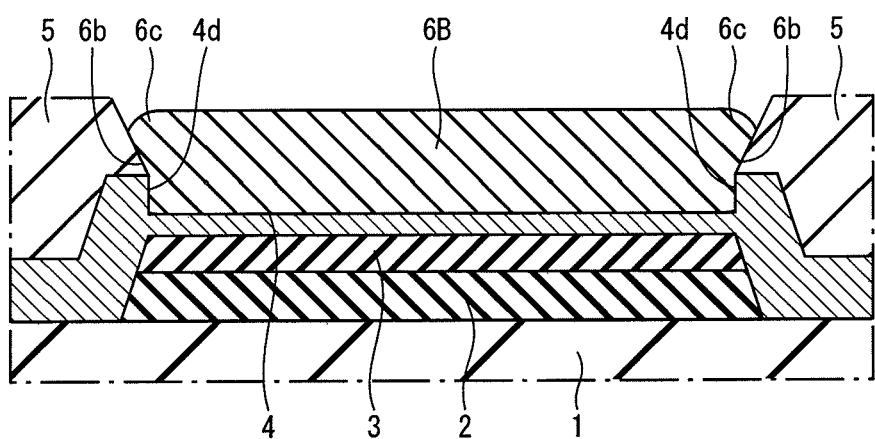

Furthermore, it is preferable that a difference between the average thickness h of the light-emitting layer 6B and the average depth t of the recessed portion 4a is equal to or smaller than 20 nm. When the average thickness h of the light-emitting layer 6B is much smaller than the average depth t of the recessed portion 4a (for example, t−h>20 nm), a portion that is out of contact with the light-emitting layer 6B (portion not covered with the light-emitting layer 6B) is formed at the inner side surface 4d of the recessed portion 4a, as shown in FIG. 21A. Then a short circuit might occur between the anode 2 and the cathode 8. On the other hand, when the average thickness h of the light-emitting layer 6B is much greater than the average depth t of the recessed portion 4a (for example, h−t>20 nm), liquid-repellency of the bank 5 causes a film thickness of a bank vicinity portion 6c of the light-emitting layer 6B to become smaller than other portions, as shown in FIG. 21B. As a result, a cross-sectional shape of the light-emitting layer 6B has a substantially convex shape, and this might result in irregular light emission caused by a difference of film thickness.

Note that, the inner side surface 4d of the recessed portion 4a only has to be in contact with at least a part of the side surface 6b of the light-emitting layer 6B. For example, as shown in FIG. 17 and FIG. 21B, when the average thickness h of the light-emitting layer 6B is equal to or greater than the average depth t of the recessed portion 4a, only a part of a lower part of the side surface 6b of the light-emitting layer 6B is in contact with the inner side surface 4d of the recessed portion 4a. On the other hand, as shown in FIG. 21A, when the average thickness h of the light-emitting layer 6B is smaller than the average depth t of the recessed portion 4a, the side surface 6b of the light-emitting layer 6B is entirely in contact with the inner side surface 4d of the recessed portion 4a.

Figure 22:
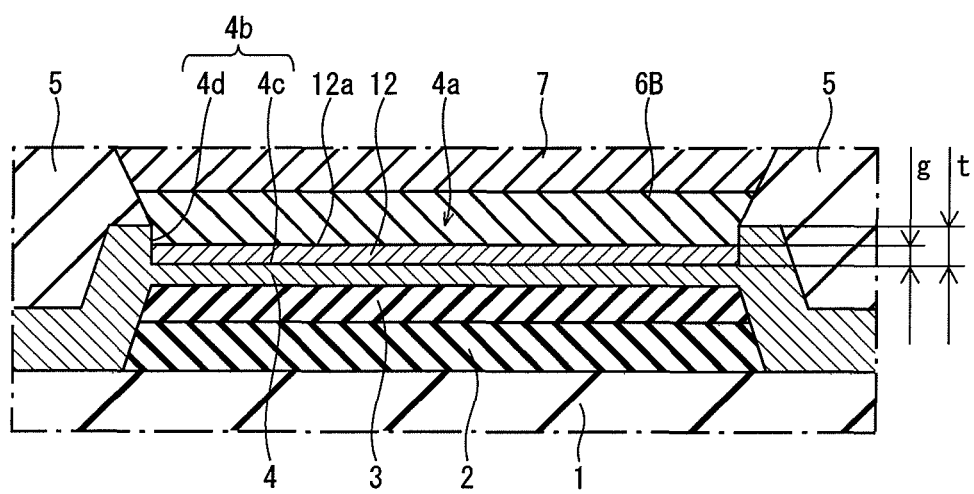
FIG. 22 is an enlarged view of a part enclosed with a dashed line in FIG. 16, with respect to a light emitter pertaining to a modification.

As shown in FIG. 22, in the recessed portion 4a of the hole injection layer 4, a liquid-philic layer 12 such as an IL layer (intermediate layer) may be formed under the light-emitting layer 6B. In this case, the drops of the ink are ejected not on the inner bottom surface 4c of the recessed portion 4a but on an upper surface 12a of the liquid-philic layer 12. However, since the upper surface 12a is liquid-philic, it is possible to stably hold the drops of the ink within the region defined by the bank 5. However, if the recessed portion 4a is totally filled with the layer 12, the inner side surface 4d of the recessed portion 4a becomes out of contact with the ink. Accordingly, an average thickness g of the liquid-philic layer 12 is preferably smaller than the average depth t of the recessed portion 4a.

The liquid-philic layer 12, which is a hole transport layer, has a thickness of approximately 10 nm to 20 nm. The liquid-philic layer 12 transports holes injected from the hole injection layer 4 into the light-emitting layer 6B. The liquid-philic layer 12 is made of an organic material having hole transport properties. The organic material having hole transport properties refers to an organic substance having the properties of transmitting generated holes by means of charge transfer reaction between molecules. The organic substance is sometimes referred to as a p-type organic semiconductor.

The liquid-philic layer 12 may be formed with either a high molecular material or a low molecular material, and is formed by wet printing. It may be preferable, for example, that the liquid-philic layer 12 includes a crosslinking agent. In this way, when the light-emitting layer 6B is formed on the liquid-philic layer 12, the liquid-philic layer 12 is less likely to be dissolved into the light-emitting layer 6B. The material having hole transport properties may be a copolymer of fluorene and triarylamine units, or a triarylamine with low molecular weight, for example. The crosslinking agent may be dipentaerythritol hexaacrylate, for example. In this case, the liquid-philic layer 12 is desirably formed with poly (3, 4-ethylenedioxythiophene) doped with polystyrene sulfonic acid (PEDOT-PSS) or a derivative (copolymer, etc.) thereof.

The bank 5 is formed with an organic material such as resin or an inorganic material such as glass and has insulating properties. Examples of the organic material include acrylic resin, polyimide resin, novolac-type phenolic resin, etc. Examples of the inorganic material include silicon oxide ($SiO_2$), silicon nitride ($Si_3N_4$), etc. It may be preferable, for example, that the bank 5 has organic solvent resistance, and have certain light transparency to visible light. Furthermore, since the bank 5 may be etched, baked, etc. when formed, it may be preferable, for example, that the bank 5 is formed with a material highly resistant to the etching and baking processes.

At least the surface of the bank 5 is provided with liquid-repellency. Accordingly, when the bank 5 is formed with a liquid-philic material, it is necessary that the surface of the bank 5 is subjected to, for example, a liquid-repellent treatment in order to make the surface of the bank 5 liquid-repellent.

Note that the bank 5 may be a pixel bank or a line bank. In the case of a pixel bank, the bank 5 is formed to surround the whole circumference of the light-emitting layer 6B for each pixel. In the case of a line bank, the bank 5 is formed to separate a plurality of pixels into columns or rows. In that case, the bank 5 is arranged to be on both sides of the light-emitting layer 6B along the direction in which the columns or rows align, and the light-emitting layer 6B is continuous in each column or line.

The electron injection layer 7 has the function of transporting electrons injected through the cathode 8 to the light-emitting layer 6B and is desirably formed, for example, from barium, phthalocyanine, lithium fluoride, or a combination thereof.

The cathode 8 has a single layer structure and is formed with ITO, or IZO (indium zinc oxide), for example. In the case of a top emission type light emitter, it is desirable that the cathode 8 is formed from a light transparent material.

The passivation layer 9 has a function of preventing the light-emitting layer 6B and other layers from being exposed to moisture and air. The passivation layer 9 is made from a material such as SiN (silicon nitride), SiON (silicon oxynitride), etc. In the case of a top emission type light emitter, it is desirable that the cathode 8 is formed from a light transparent material.

<Method of Manufacturing Light Emitter 1000C>

FIGS. 23A-23D are processing drawings for explaining a method of manufacturing the light emitter 1000C pertaining to Embodiment 2. FIGS. 24E-24H are processing drawings for explaining the method of manufacturing the light emitter 1000C pertaining to Embodiment 2, which follows FIG. 23D.

In the manufacturing process of the light emitter 1000C pertaining to Embodiment 2, first, as shown in FIG. 23A, the anode 2 is formed on the substrate 1 that is made of glass together with other anodes 2 in a matrix or in line, by forming a thin Ag film, for example, by a sputtering method and then patterning the thin Ag film, for example, by photolithography. Note that the thin Ag film may be formed by vacuum deposition or the like.

Next, as shown in FIG. 23B, a thin ITO film is formed using the sputtering method or the like. The formed thin ITO film is then patterned using the photolithography or the like to form the ITO layer 3.

Following this, a thin film 11 containing a metal compound soluble in a predetermined solvent is formed. For example, using a compound containing WOx or MoWOx, the thin film 111 of WOx or MoWOx is formed by a vacuum deposition method or a sputtering method, to be uniform all over an upper surface of the substrate 1.

Next, as shown in FIG. 23C, the bank 5 is formed, for example, by photolithography, so as to surround each pixel region (region at which the anode 2 is positioned). In such a case, for example, a resist film (for example, resin film) including a resist material is formed on the thin film 11 by coating. Here, the resist film serves as a bank film and the resist material serves as a bank material. Subsequently, a resist pattern is formed on the resist film. After that, a desired portion of the resist film is etched by applying a developing solution and removed to form patterning of the bank 5. Note that, when the bank 5 is formed from an inorganic material, the bank is formed by a CVD method, for example. After etching, residuals of the resist film attached to a surface of the thin film 11 are removed by hydrofluoric acid, for example. Furthermore, a liquid-repellent treatment is applied to the surface of the bank 5, if necessary.

Next, as shown in FIG. 23D, the hole injection layer 4 is formed by forming the recessed portion 4a by melting a part of the thin film 11. Thereby, in the hole injection layer 4, the region defined by the bank 5 has a film thickness smaller than a film thickness of other regions. The recessed portion 4a is formed, for example, when an impure substance such as hydrofluoric acid remaining on the surface of the bank 5 is being cleaned with pure water after residuals of the resist film are removed, by melting the region defined by the bank 5 on an upper surface of the thin film 11 with the pure water. In such a case, the predetermined solvent is pure water, and it is possible to change a depth and a shape of the recessed portion 4a by changing condition of cleaning with the pure water.

As a specific method, for example, the substrate 1 is cleaned by ejecting pure water (for example, of a room temperature) thereon, while a spin coater keeps rotating the substrate 1. After that, while the substrate 1 is kept rotating, pure water is stopped being ejected and then drained. In this case, it is possible to change the depth and the shape of the recessed portion 4a by changing a time period for ejecting the pure water. Since a melting speed of the thin film 11 also changes according to a temperature of pure water, it is also possible to adjust the depth and the shape of the recessed portion 4a by the temperature of pure water.

A method for forming the recessed portion 4a is not limited to the above. For example, after the formation of the bank 5, while the residuals of the resist film that are attached to the surface of the thin film 11 are being cleaned with a cleaning liquid such as pure water, the recessed portion 4a may be formed by melting a part of the thin film 11 by the cleaning liquid at the same time. In such a case, the predetermined solvent is the cleaning liquid. Alternatively, while the resist film is being etched by the developing solution to form the bank 5 and the residuals of the resist film that are attached on the thin film 11 are being cleaned by the developing solution, the recessed portion 4a may be formed by melting the part of the thin film 11 at the same time. In such a case, the predetermined solvent is the developing solution.

When the hole injection layer 4 is formed by dissolving the thin film 11 with use of a solvent such as a cleaning liquid and a developing solution that are used in forming the bank 5, productive efficiency is high since a different predetermined solvent to form the recessed portion 4a is not required and an additional process to form the recessed portion 4a is also not required.

Note that the recessed portion 4a is not limited to being formed by using the predetermined solvent. Another method like the following may be used. For example, first, a thin film made of WOx or MoWOx is formed with use of spattering and photolithography at all the areas except an area at which the anode 2 is located. After that, on the thin film, another thin film made of WOx or MoWOx is formed to cover all the areas and the hole injection layer 4 having the recessed portion is formed at the area at which the anode 2 is located.

Figure 24E:
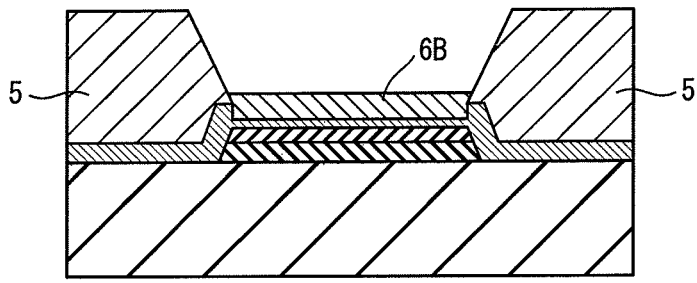
FIGS. 24E-24H are processing drawings for explaining the method of manufacturing the light emitter pertaining to Embodiment 2, which follows FIG. 23D.

Next, as shown in FIG. 24E, the light-emitting layer 6B is formed by ejecting drops of the ink by, for example, the ink-jet method in the region defined by the bank 5, coating the ink along the inner bottom surface 4c and the inner side surface 4d of the recessed portion 4a of the hole injection layer 4, and drying the ink. Note that the ink may be dropped by a dispenser method, a nozzle-coat method, a spin coat method, an intaglio printing, a letter press printing, or the like.

Figure 24F:
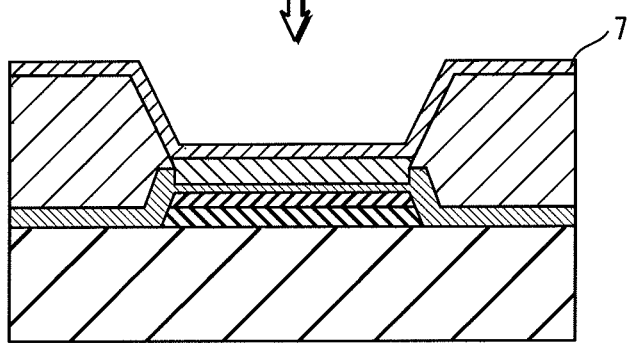
Figure 24G:
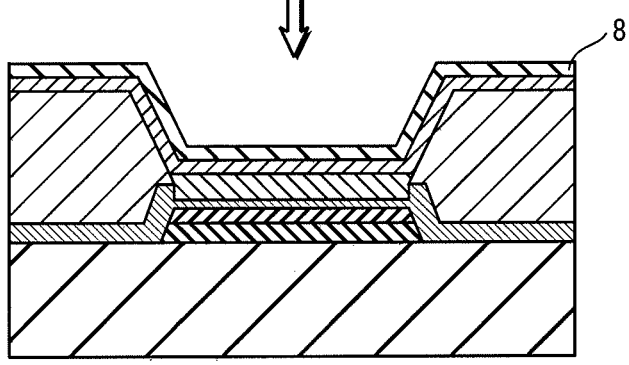
Figure 24H:
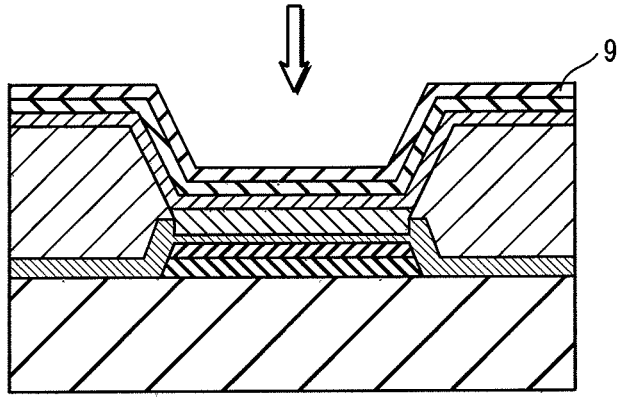

Next, as shown in FIG. 24F, a thin barium film as the electron injection layer 7 is formed using a vacuum deposition method or the like. Then, as shown in FIG. 24G, an ITO thin film as the cathode 8 is formed using a sputtering method. As shown in FIG. 24H, the passivation layer 9 is further formed.

Embodiment 3

A light emitter 1000D pertaining to Embodiment 3 is greatly different from the light emitter 1000C pertaining to Embodiment 2 in that the ITO layer is not formed under the hole injection layer and that a protection film is formed on the hole injection layer. The following explanation focuses on the difference from Embodiment 2, and explanation of the same structure as the first embodiment will be simplified or omitted.

(Structure of the Light Emitter 1000D)

Figure 25:
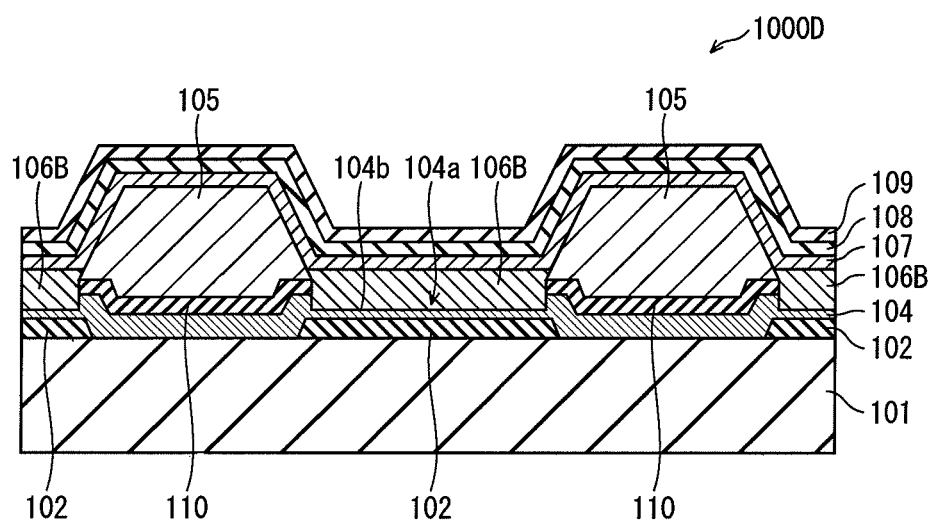
FIG. 25 is a schematic view showing a layered condition of layers constituting a light emitter pertaining to Embodiment 3.

FIG. 25 is a schematic view showing a layered condition of layers constituting the light emitter 1000D. As shown in FIG. 25, the light emitter 1000D includes an anode 102, a hole injection layer 104 as a charge injection transport layer, and a protective layer 110 which are disposed on a substrate 101 in this order. Note that the hole injection layer 104 is formed across an entire upper surface of the substrate 101, but the protective layer 110 is not formed above the anode 102. In addition, an ITO layer does not exist between the anode 102 and the hole injection layer 104.

On the hole injection layer 104, a bank 105 for defining pixels is formed. A light-emitting layer 106B is layered in a region defined by the bank 105, and on the light-emitting layer 106, an electron injection layer 107, a cathode 108, and a passivation layer 109 are formed so as to be continuous with respective layers of an adjacent pixel, passing over the region defined by the bank 105.

(Method of Manufacturing Light Emitter)

Figure 26A:
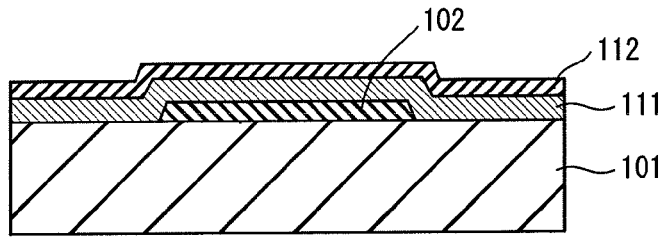
FIGS. 26A-26D are processing drawings for explaining a method of manufacturing the light emitter pertaining to Embodiment 3.

FIGS. 26A-26D are processing drawings for explaining a method of manufacturing the light emitter 1000D. In the manufacturing process of the light emitter 1000D, as shown in FIG. 26A, first, on the substrate 101 that is made of glass, the anode 102 is formed with an aluminum-based (Al) material. Next, a thin film 111 made of WOx or MoWOx, which will be the hole injection layer 104 later, is formed on the anode 102. Then a thin film 112 made of WOx or MoWOx, which will be the protective layer 110, is formed on the thin film 111. The thin film 112 protects the hole injection layer 104 during etching for forming the bank 105.

Figure 26B:
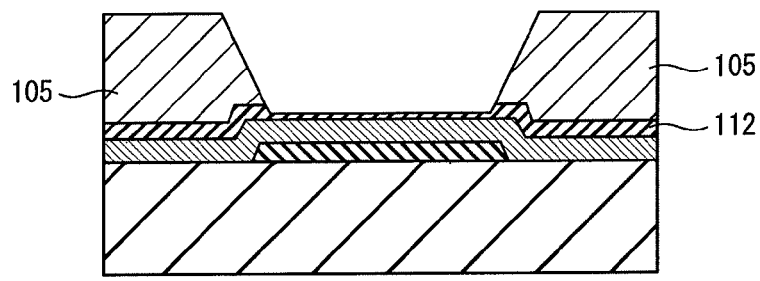

Next, as shown in FIG. 26B, the bank 105 is formed on the thin film 112. To be specific, a resist film including a resist material is formed on the thin film 112, and a resist pattern is formed on the film. After that, a desired portion of the resist film is etched by applying a developing solution, and is removed to form a pattern of the bank 105. Note that after formation of the bank 105, an impure substance such as hydrofluoric acid remaining on a surface of the bank 105 is cleaned by a cleaning liquid such as pure water so as to be removed, and a region defined by the bank 105 on an upper surface of the thin film 112 is melted by the cleaning liquid and becomes recessed.

Figure 26C:
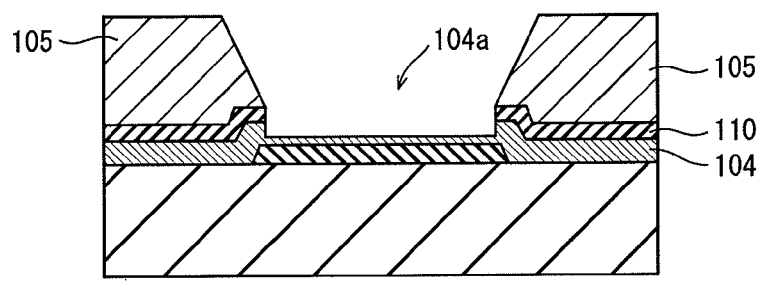

Furthermore, as shown in FIG. 26C, as the treatment with the cleaning liquid continues, the entire region defined by the bank 105 on the thin film 112 melts and accordingly the protective layer 110 is formed. When the thin film 112 melts, the thin film 111 is exposed. As a result, the region defined by the bank 105 on the upper surface of the thin film 111 melts and becomes recessed and then a recessed portion 104a is formed. Thus, the hole injection layer 104 is formed.

Figure 26D:
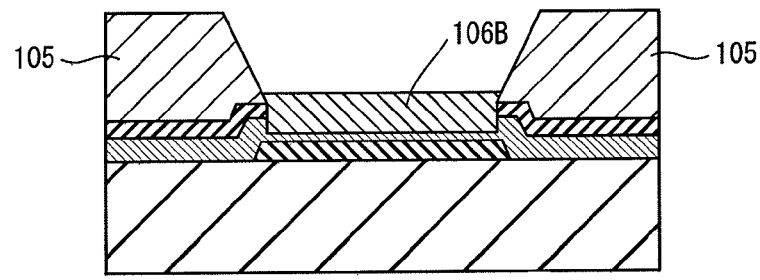

Next, as shown in FIG. 26D, the light-emitting layer 106 is formed within the region defined by the bank 105. Subsequent processes are the same as in Embodiment 2, and therefore a description thereof is omitted.

Embodiment 4

A light emitter 1000E pertaining to Embodiment 4 is greatly different from the light emitter 1000D pertaining to Embodiment 3, with respect to an area at which a hole injection layer is formed. The following explanation focuses on the difference from Embodiment 3, and explanation of the same structure as Embodiment 3 will be simplified or omitted.

(Structure of the Light Emitter)

Figure 27:
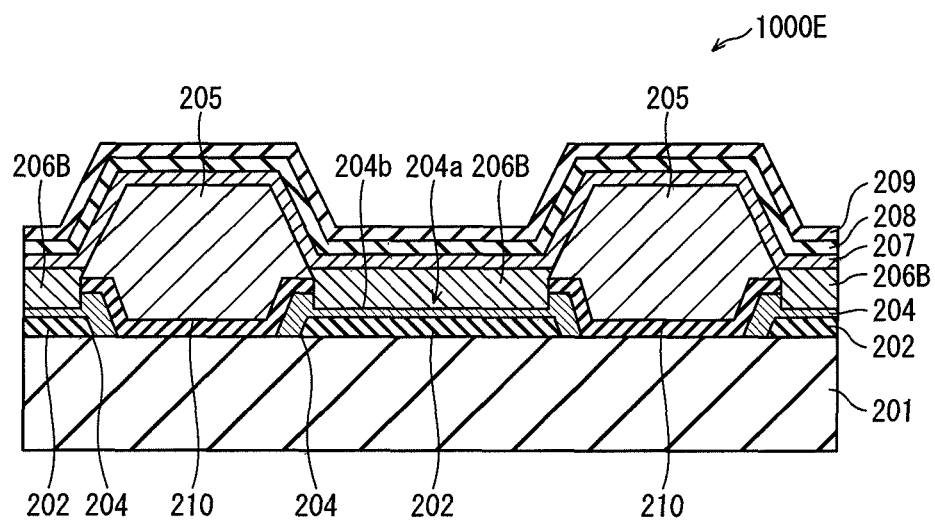
FIG. 27 is a schematic view showing a layered condition of layers constituting a light emitter pertaining to Embodiment 4.

FIG. 27 is a schematic view showing a layered condition of layers constituting the light emitter 1000E. As shown in FIG. 27, the light emitter 1000E includes an anode 202, a hole injection layer 204 as a charge injection transport layer, and a protective layer 210 which are disposed on a substrate 201 in this order. Note that the hole injection layer 204 is not formed across the entire upper surface of the substrate 201, but formed only on the anode 202 and at a surrounding area of the anode 202. On the other hand, the protective layer 210 is not formed on the anode 202.

On the hole injection layer 204, a bank 205 for defining pixels is formed. A light-emitting layer 206B is layered in a region defined by the bank 205, and on the light-emitting layer 206B, an electron injection layer 207, a cathode 208, and a passivation layer 209 are formed so as to be continuous with respective layers of an adjacent pixel, passing over the region defined by the bank 205.

(Method of Manufacturing Light Emitter)

Figure 28A:
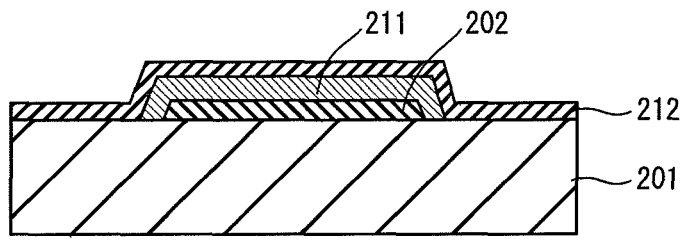
FIGS. 28A-28D are processing drawings for explaining a method of manufacturing the light emitter pertaining to Embodiment 4.

FIGS. 28A-28D are processing drawings for explaining a method of manufacturing the light emitter 1000E. In the manufacturing process of the light emitter 1000E, as shown in FIG. 28A, first, on the substrate 201 that is made of glass, the anode 202 is formed with an Al material. Next, an oxide film 211 that will be the hole injection layer 204 is formed by oxidizing an exposed surface (upper surface and side surface) of the anode 202. Then a thin film 212 made of WOx or MoWOx, which will be the protective layer 210 later, is formed on the oxide film 211.

Figure 28B:
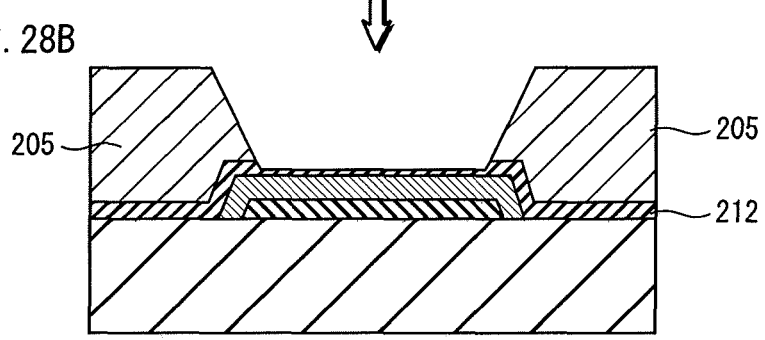

Next, as shown in FIG. 28B, the bank 205 is formed on the thin film 212. An impure substance such as hydrofluoric acid remaining on a surface of the bank 205 is cleaned by a cleaning liquid such as pure water so as to be removed, and a region defined by the bank 205 on an upper surface of the thin film 212 is melted by the cleaning liquid and becomes recessed.

Figure 28C:
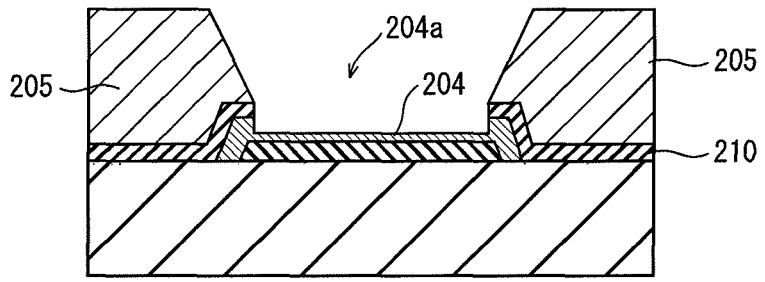

Furthermore, as shown in FIG. 28C, as the treatment with the cleaning liquid continues, the entire region defined by the bank 205 on the thin film 212 melts and accordingly the protective layer 210 is formed. In addition, when the thin film 212 melts, the region defined by the bank 205 on the oxide film 211 is exposed. Accordingly, the upper surface of the region also melts and becomes recessed, and then the recessed portion 204a is formed. Thus, the hole injection layer 204 is formed.

Figure 28D:
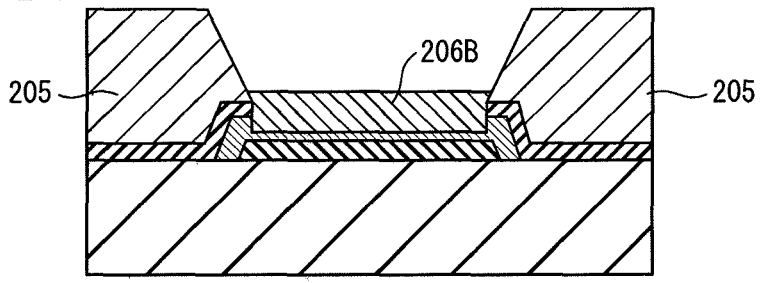

Next, as shown in FIG. 28D, the light-emitting layer 206B is formed within the region defined by the bank 205. Subsequent processes are the same as in Embodiment 2, and therefore a description thereof is omitted.

Embodiment 5

Figure 29:
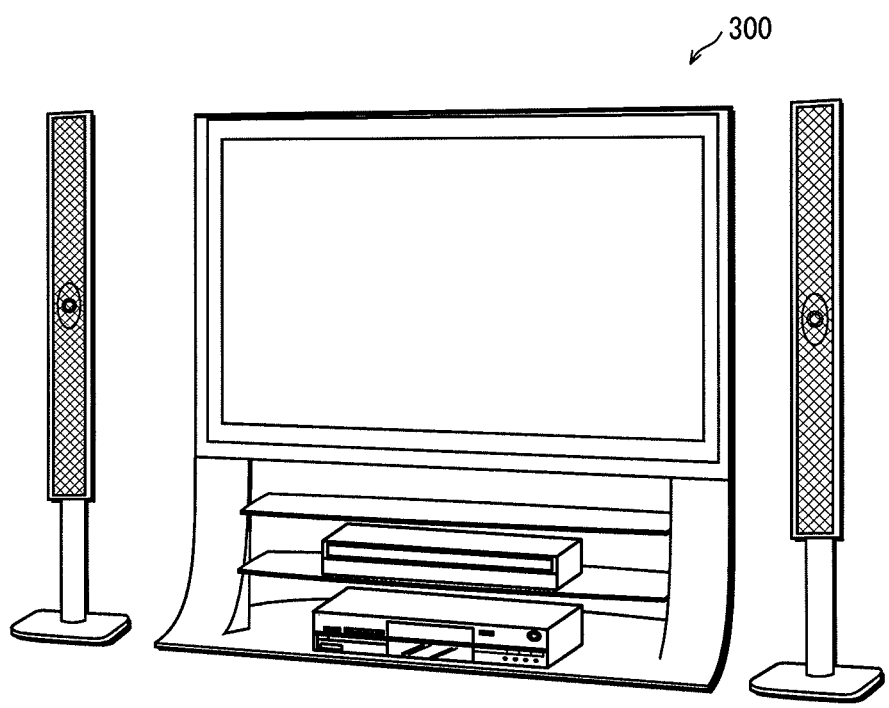
FIG. 29 is a perspective view showing apparatuses such as a display apparatus pertaining to Embodiment 5.

FIG. 29 is a perspective view showing apparatuses such as a display apparatus pertaining to Embodiment 5. As shown in FIG. 29, a display apparatus 300 pertaining to one aspect of the present disclosure is an organic EL display formed by a plurality of pixels arranged in a matrix. Each pixel emits a color corresponding to one of R (red), G (green), and B (blue) and composed of a light emitter pertaining to one aspect of the present disclosure.

(Modification)

Description has been provided of the light emitter, the display apparatus and the manufacturing method of the light emitter based on various embodiments. However, the light emitter, the display apparatus and the manufacturing method of the light emitter of the present disclosure are not limited to the above embodiments.

The light emitter is not limited to the top-emission type, and may be a bottom-emission type.

<Additional Matters>

The expression "occupied energy level" as referred to in the present specification includes an energy level of a so-called semi-occupied orbital, which is an electron orbital occupied by at least one electron.

Further, the implementation of the organic EL element of the present disclosure is not limited to a structure where the organic EL element is used in an independent state. A plurality of the organic EL elements of the present disclosure may be integrated on a substrate as pixels to form an organic EL panel. An organic EL display so yielded may be implemented by appropriately arranging the thickness of each of the layers in each of the organic EL elements.

INDUSTRIAL APPLICABILITY

The organic EL element pertaining to the present disclosure is to be used as display elements for mobile phone displays and TVs, and as a light source for various applications. Regardless of the specific use thereof, the organic EL element of the present disclosure is applicable as an organic EL element having a wide range of luminous intensity from low luminous intensity to high luminous intensity for the use as a light source or the like, and which can be driven at a low voltage. The organic EL element of the present disclosure, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST

1 TFT substrate
2, 102, 202 anode
3 indium tin oxide (ITO) layer
4, 104, 204 hole injection layer (tungsten oxide layer)
4a recessed portion
4c inner bottom surface of recessed portion
4d inner side surface of recessed portion
5, 105, 205 bank
5a bottom surface of bank
5c level of bottom surface of bank
5d lower edge 5d of bank
6A buffer layer
6B, 106B, 206B light-emitting layer
6a bottom surface of light-emitting layer
6b side surface of light-emitting layer
7 electron injection layer
8, 108, 208 cathode
8A barium layer
8B aluminum layer
9 passivation layer
10 substrate
70 conductive silicon substrate
80 tungsten oxide layer
300 display apparatus
1000, 1000C to 1000E organic EL element
1000A sample device for photoelectron spectroscopy measurement
1000B hole-only element

The invention claimed is:

1. An organic EL element, comprising:
an anode;
a cathode;
a functional layer that is disposed between the anode and the cathode and includes at least a light-emitting layer made of an organic material;
a hole injection layer disposed between the anode and the functional layer; and
a bank that defines a region in which the light-emitting layer is to be formed, wherein
the hole injection layer contains tungsten oxide, includes an occupied energy level that is approximately 1.8 electron volts to approximately 3.6 electron volts lower than a lowest energy level of a valence band of the hole injection layer in terms of a binding energy, and has a recessed portion in an upper surface thereof at the region defined by the bank,
the recessed portion has (i) an inner bottom surface that is in contact with a bottom surface of the functional layer, and (ii) an inner side surface that is continuous with the inner bottom surface and in contact at least with part of a side surface of the functional layer, and
the inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

2. The organic EL element of claim 1, wherein the occupied energy level at an interface between the hole injection layer and the functional layer is approximately equal to an energy level of a highest occupied molecular orbital of the functional layer in terms of the binding energy.

3. The organic EL element of claim 1, wherein a gap between the occupied energy level at an interface between the hole injection layer and the functional layer and an energy level of a highest occupied molecular orbital of the functional layer is at most approximately 0.3 electron volts in terms of the binding energy.

4. The organic EL element of claim 1, wherein an ultraviolet photoelectron spectroscopy spectrum of the hole injection layer exhibits an upward protrusion that is approximately 1.8 electron volts to approximately 3.6 electron volts lower than the lowest energy level of the valence band in terms of the binding energy.

5. The organic EL element of claim 1, wherein an X-ray photoelectron spectroscopy spectrum of the hole injection layer exhibits an upward protrusion that is approximately 1.8 electron volts to approximately 3.6 electron volts lower than the lowest energy level of the valence band in terms of the binding energy.

6. The organic EL element of claim 1, wherein a differential spectrum obtained by differentiating an ultraviolet photoelectron spectroscopy spectrum of the hole injection layer has a shape that is expressed by a non-exponential function throughout a range between approximately 2.0 electron volts and approximately 3.2 electron volts lower than the lowest energy level of the valence band in terms of the binding energy.

7. The organic EL element of claim 1, wherein the functional layer comprises an amine-containing material.

8. The organic EL element of claim 1, wherein the light-emitting layer emits light by recombination of electrons and holes injected to the functional layer, and the functional layer further includes one of a hole transfer layer that transfers the holes and a buffer layer that adjusts optical characteristics of the organic EL element and/or blocks electrons.

9. The organic EL element of claim 1, wherein the occupied energy level is approximately 2.0 electron volts to 3.2 electron volts lower than the lowest energy level of the valence band in terms of the binding energy.

10. The organic EL element of claim 1, wherein the bank is liquid-repellent, and the hole injection layer is liquid-philic.

11. A display device including the organic EL element of claim 1.

12. A manufacturing method of an organic EL element, comprising:
preparing an anode;
forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm.sup.2 and at most approximately 2.8 W/cm.sup.2;
forming a bank above the tungsten oxide layer by forming a resist film including a resist material above the tungsten oxide layer and etching the resist film with a developing solution;
after the formation of the bank, forming a hole injection layer by cleaning residuals of the resist film that adhere to the tungsten oxide layer with a cleaning liquid and dissolving part of the tungsten oxide layer with the cleaning liquid, the hole injection layer having a recessed portion in an upper surface thereof at a region defined by the bank, the recessed portion having an inner bottom surface and an inner side surface continuous with the inner bottom surface;
forming a functional layer by coating the inner bottom surface and the inner side surface of the recessed portion of the hole injection layer with ink by ejecting drops of the ink into the region defined by the bank and drying the ink; and
forming a cathode above the functional layer, wherein
in the formation of the hole injection layer, the inner side surface of the recessed portion is formed to be in contact with at least part of a side surface of the functional layer and to have a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

13. A manufacturing method of an organic EL element, comprising:
preparing an anode;
forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm.sup.2 and at most approximately 2.8 W/cm.sup.2;
forming a bank above the tungsten oxide layer by forming a resist film including a resist material above the tungsten oxide layer and etching the resist film with a developing solution, and forming a hole injection layer by cleaning residuals of the resist film that adhere to the tungsten oxide layer with the developing solution and dissolving part of the tungsten oxide layer with the developing solution, the hole injection layer having a recessed portion in an upper surface thereof at a region defined by the bank, the recessed portion having an inner bottom surface and an inner side surface continuous with the inner bottom surface;
forming a functional layer by coating the inner bottom surface and the inner side surface of the recessed portion of the hole injection layer with ink by ejecting drops of the ink into the region defined by the bank and drying the ink; and
forming a cathode above the functional layer, wherein
in the formation of the hole injection layer, the inner side surface of the recessed portion is formed to be in contact with at least part of a side surface of the functional layer and to have a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

14. The manufacturing method of claim 12, wherein
the tungsten oxide layer is formed such that an ultraviolet photoelectron spectroscopy spectrum of the tungsten oxide layer exhibits an upward protrusion that is approximately 1.8 electron volts to approximately 3.6 electron volts lower than a lowest energy level of a valence band of the tungsten oxide layer in terms of a binding energy.

15. The manufacturing method of claim 12, wherein
the tungsten oxide layer is formed such that a differential spectrum obtained by differentiating an ultraviolet photoelectron spectroscopy spectrum of the tungsten oxide layer has a shape that is expressed by a non-exponential function throughout a range between approximately 2.0 electron volts and approximately 3.2 electron volts lower than a lowest energy level of a valence band of the tungsten oxide layer in terms of a binding energy.

16. The organic EL element of claim 1, wherein
the upper surface of the hole injection layer which has the recessed portion is located closer to the anode than entire bottom surfaces of the banks.

17. The organic EL element of claim 1, wherein
a film thickness of the hole injection layer in a region defined by the recessed portion is smaller than a film thickness in other regions, and the film thickness in the other regions is uniform.

18. The organic EL element of claim 1, wherein
a film thickness of the light-emitting layer is uniform.

19. The organic EL element of claim 1, wherein
the recessed portion extends under the bottom surface of at least one of the banks.

20. The organic EL element of claim 1, wherein
the inner side surface of the recessed portion and a side surface of at least one of the banks have a same inclination angle.

* * * * *